(12) United States Patent
Chung et al.

(10) Patent No.: US 12,159,869 B2
(45) Date of Patent: Dec. 3, 2024

(54) BACKSIDE INTERCONNECT STRUCTURES FOR SEMICONDUCTOR DEVICES AND METHODS OF FORMING THE SAME

(71) Applicant: Taiwan Semiconductor Manufacturing Co., Ltd., Hsinchu (TW)

(72) Inventors: Cheng-Ting Chung, Hsinchu (TW); Hou-Yu Chen, Zhubei (TW); Ching-Wei Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/815,112

(22) Filed: Jul. 26, 2022

(65) Prior Publication Data

US 2022/0367454 A1   Nov. 17, 2022

Related U.S. Application Data

(62) Division of application No. 17/026,870, filed on Sep. 21, 2020, now Pat. No. 11,664,374.

(Continued)

(51) Int. Cl.
| | |
|---|---|
| H01L 27/088 | (2006.01) |
| H01L 21/762 | (2006.01) |
| H01L 23/50 | (2006.01) |
| H01L 27/06 | (2006.01) |
| H01L 29/06 | (2006.01) |
| H01L 29/417 | (2006.01) |

(Continued)

(52) U.S. Cl.
CPC .... *H01L 27/0886* (2013.01); *H01L 21/76224* (2013.01); *H01L 23/50* (2013.01); *H01L 27/0688* (2013.01); *H01L 29/0649* (2013.01); *H01L 29/41791* (2013.01); *H01L 29/66795* (2013.01); *H01L 29/785* (2013.01)

(58) Field of Classification Search
CPC ............ H01L 27/0886; H01L 27/0688; H01L 27/088; H01L 27/0924; H01L 21/76224; H01L 21/76898; H01L 21/823431; H01L 21/76895; H01L 21/823475; H01L 21/823471; H01L 23/50; H01L 23/5286; H01L 23/535; H01L 29/0649; H01L 29/41791; H01L 29/66795; H01L 29/785
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

*Primary Examiner* — Dao H Nguyen
(74) *Attorney, Agent, or Firm* — Slater Matsil, LLP

(57) ABSTRACT

Backside interconnect structures having reduced critical dimensions for semiconductor devices and methods of forming the same are disclosed. In an embodiment, a device includes a first transistor structure over a front-side of a substrate; a first backside interconnect structure over a backside of the substrate, the first backside interconnect structure including first conductive features having tapered sidewalls with widths that narrow in a direction away from the substrate; a power rail extending through the substrate, the power rail being electrically coupled to the first conductive features; and a first source/drain contact extending from the power rail to a first source/drain region of the first transistor structure.

20 Claims, 51 Drawing Sheets

Related U.S. Application Data

(60) Provisional application No. 63/031,635, filed on May 29, 2020.

(51) Int. Cl.
  H01L 29/66 (2006.01)
  H01L 29/78 (2006.01)

(56) References Cited

U.S. PATENT DOCUMENTS

| | | | |
|---|---|---|---|
| 9,331,098 B2 * | 5/2016 | Stuber | H01L 21/76898 |
| 9,412,817 B2 | 8/2016 | Yang et al. | |
| 9,412,828 B2 | 8/2016 | Ching et al. | |
| 9,472,618 B2 | 10/2016 | Oxland | |
| 9,478,507 B2 * | 10/2016 | Stuber | H01L 23/5226 |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2002/0020862 A1 * | 2/2002 | Livengood | H01L 23/481 |
| | | | 257/E21.597 |
| 2010/0230735 A1 * | 9/2010 | Zhu | H10B 12/03 |
| | | | 438/386 |
| 2011/0084365 A1 * | 4/2011 | Law | H01L 25/0657 |
| | | | 257/784 |
| 2012/0088339 A1 * | 4/2012 | Molin | H01L 29/66363 |
| | | | 438/270 |
| 2013/0134585 A1 * | 5/2013 | Stuber | H01L 24/80 |
| | | | 257/737 |
| 2019/0006296 A1 | 1/2019 | Morrow et al. | |
| 2020/0303509 A1 * | 9/2020 | Mehandru | H01L 29/4175 |
| 2020/0373331 A1 * | 11/2020 | Kim | H01L 27/1203 |
| 2021/0028112 A1 * | 1/2021 | Kim | H01L 29/0847 |
| 2021/0375722 A1 * | 12/2021 | Kim | H01L 21/823431 |

\* cited by examiner

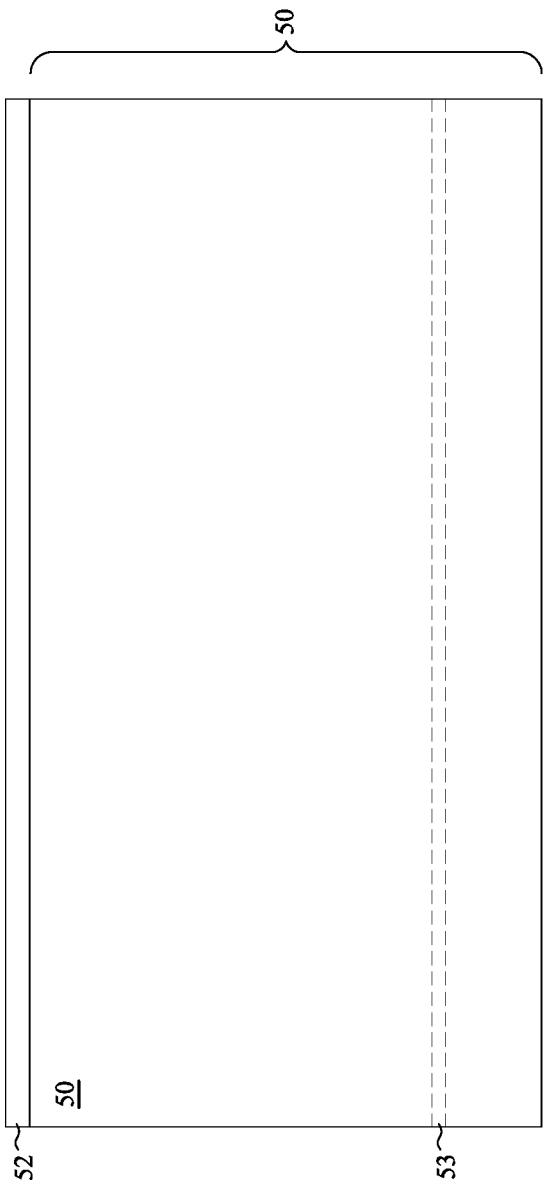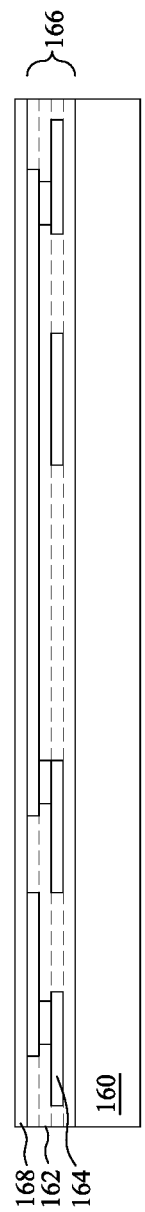
Fig. 2A
Fig. 2B

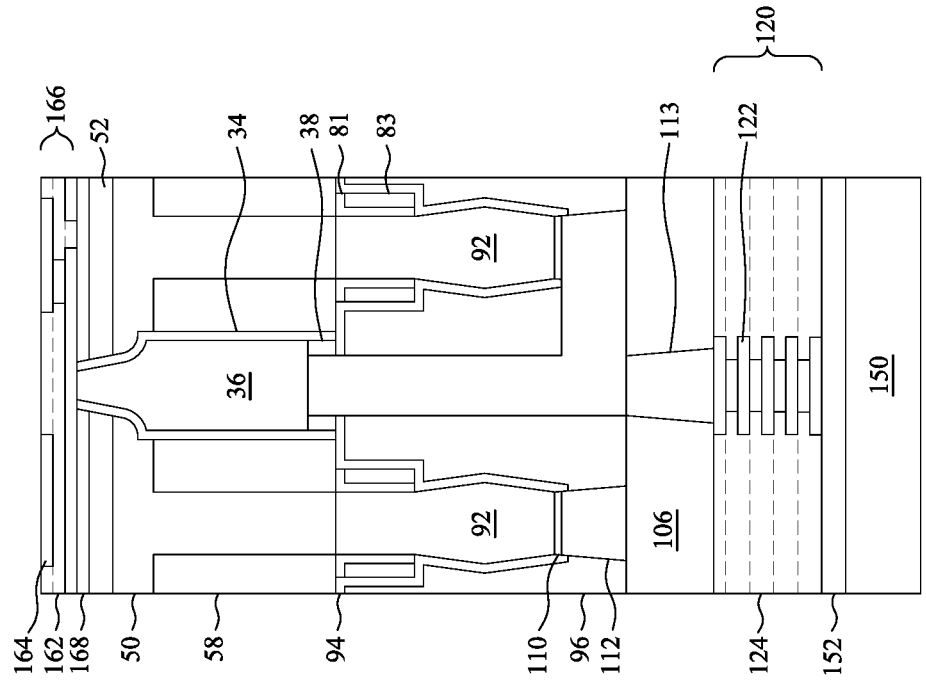
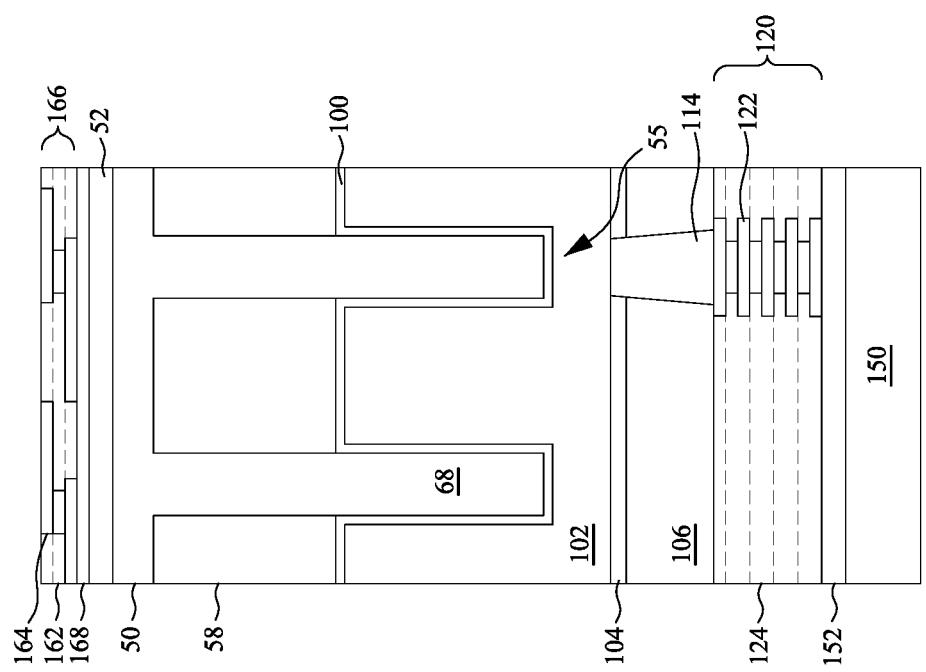
Fig. 29B
Fig. 29A

BACKSIDE INTERCONNECT STRUCTURES FOR SEMICONDUCTOR DEVICES AND METHODS OF FORMING THE SAME

PRIORITY CLAIM AND CROSS-REFERENCE

This application is a divisional of U.S. patent application Ser. No. 17/026,870, filed on Sep. 21, 2020, now U.S. Pat. No. 11,664,374, issued May 30, 2023, and entitled "Backside Interconnect Structures for Semiconductor Devices and Methods of Forming the Same," which claims the benefit of U.S. Provisional Patent Application No. 63/031,635, filed on May 29, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 3, 4, 5, 6, 7, 8, 9, 10, 11, 12, 13A, 13B, 13C, 14A, 14B, 14C, 15A, 15B, 15C, 16A, 16B, 16C, 17A, 17B, 17C, 17D, 18A, 18B, 18C, 19A, 19B, 19C, 20A, 20B, 20C, 21A, 21B, 21C, 22A, 22B, 22C, 22D, 23A, 23B, 23C, 23D, 24A, 24B, 24C, 25A, 25B, 25C, 26A, 26B, 26C, 27A, 27B, 27C, 28A, 28B, 28C, 29A, 29B, 29C, 30A, 30B, 30C, 30D, 31A, 31B, and 31C are cross-sectional views of intermediate stages in the manufacturing of FinFETs, in accordance with some embodiments.

DETAILED DESCRIPTION

Figure 1:
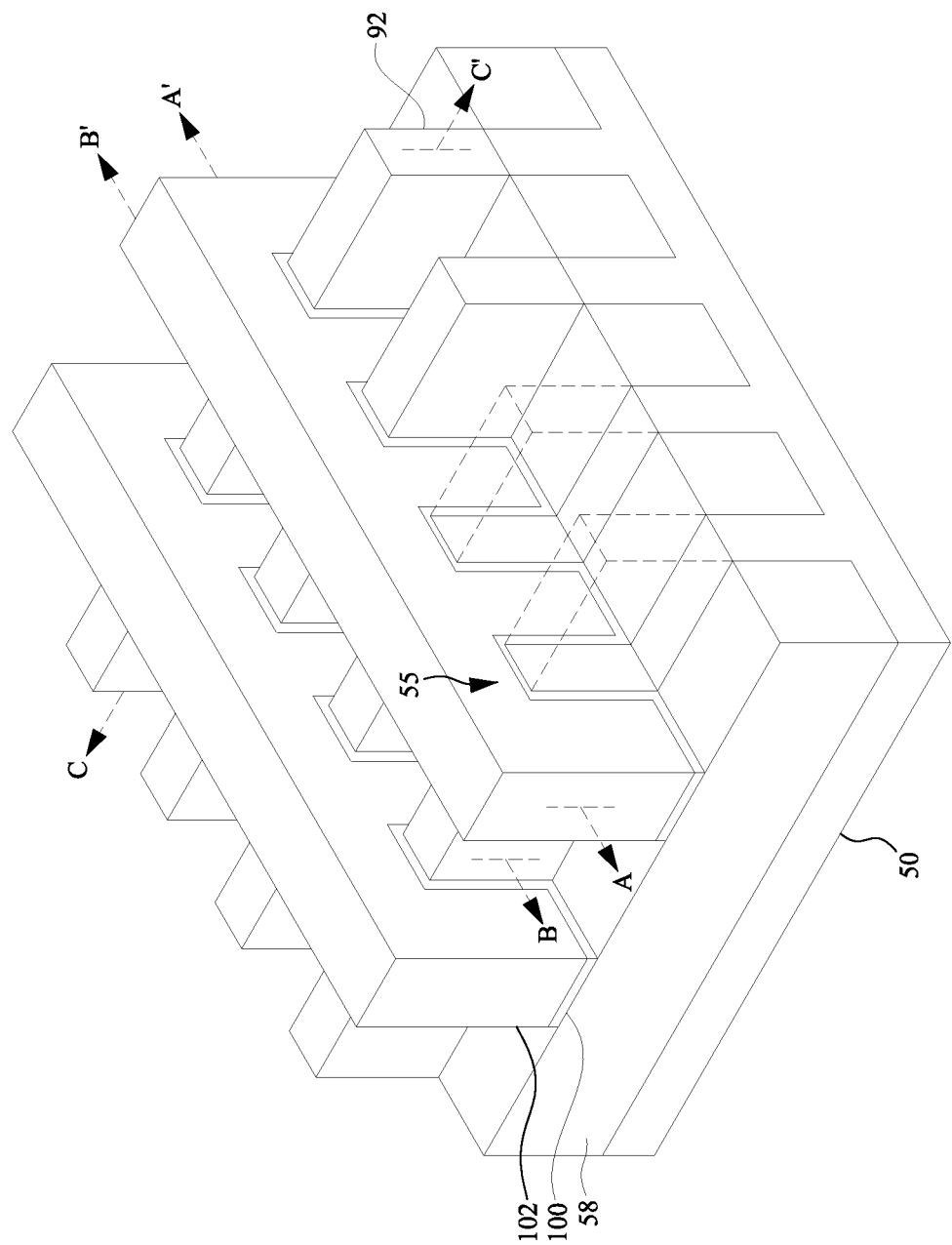
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming backside power rails and backside interconnect structures in semiconductor devices and semiconductor devices including the same. The methods include forming a fine-pitch backside interconnect structure over a carrier, bonding a substrate to the fine-pitch backside interconnect structure, forming fins in the substrate, forming backside power rails extending through the substrate adjacent the fins to the fine-pitch backside interconnect structure. Bonding the substrate to the fine-pitch backside interconnect structure allows for better overlay control in the fine-pitch backside interconnect structure and allows for fine pitch conductive lines to be formed in the fine-pitch backside interconnect structure. This reduces device size, increases device density, and reduces device defects.

FIG. 1 illustrates an example of FinFETs in a three-dimensional view, in accordance with some embodiments. The FinFETs comprises fins 55 on a substrate 50 (e.g., a semiconductor substrate). Shallow trench isolation (STI) regions 58 are disposed in the substrate 50, and the fins 55 protrude above and from between neighboring STI regions 58. Although the STI regions 58 are described/illustrated as being separate from the substrate 50, as used herein the term "substrate" may be used to refer to just the semiconductor substrate or a semiconductor substrate inclusive of isolation regions. Additionally, although the fins 55 are illustrated as being single, continuous materials with the substrate 50, the fins 55 and/or the substrate 50 may comprise single materials or pluralities of materials. In this context, the fins 55 refer to the portions extending between the neighboring STI regions 58.

Gate dielectric layers 100 are along sidewalls and over top surfaces of the fins 55, and gate electrodes 102 are over the gate dielectric layers 100. Source/drain regions 92 are disposed in opposite sides of the fins 55 with respect to the gate dielectric layers 100 and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the source/drain regions 92 of a FinFET. Cross-section B-B' is parallel to cross-section A-A' and extends through a source/drain region 92 of the FinFET. Cross-section C-C' is perpendicular to cross-section A-A' and is along a longitudinal axis of a fin 55 and in a direction of, for example, a current flow between the source/drain regions 92 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2A through 31C are cross-sectional views of intermediate stages in the manufacturing of FinFETs, in accordance with some embodiments. FIGS. 13A, 14A, 15A, 16A, 17A, 18A, 19A, 20A, 21A, 22A, 23A, 24A, 25A, 26A, 27A, 28A, 29A, 30A, and 31A illustrate reference cross-section A-A' illustrated in FIG. 1. FIGS. 2A through 12, 13B, 14B, 15B, 16B, 17B, 17D, 18B, 19B, 20B, 21B, 22B, 22D, 23B, 23D, 24B, 25B, 26B, 27B, 28B, 29B, 30B, and 31B illustrate reference cross-section B-B' illustrated in FIG. 1. FIGS. 13C, 14C, 15C, 16C, 17C, 18C, 19C, 20C, 21C, 22C, 23C, 24C, 25C, 26C, 27C, 28C, 29C, 30C, 30D, and 31C illustrate reference cross-section C-C' illustrated in FIG. 1.

In FIGS. 2A and 2B, a substrate 50 is provided and a first backside interconnect structure 166 is formed over a first carrier substrate 160. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 may comprise an n-type region and a p-type region. The n-type region can be for forming n-type devices, such as NMOS transistors, e.g., n-type FinFETs. The p-type region can be for forming p-type devices, such as PMOS transistors, e.g., p-type FinFETs. The n-type region may be physically separated from the p-type region, and any number of device features (e.g., other active devices, doped regions, isolation structures, etc.) may be disposed between the n-type region and the p-type region.

As illustrated in FIG. 2A, a first bonding layer 52 is formed over the substrate 50. The first bonding layer 52 will be subsequently used to bond the substrate 50 to the first backside interconnect structure 166. In some embodiments, the first bonding layer 52 comprises silicon oxide, such as a high-density plasma (HDP) oxide or the like. The first bonding layer 52 may be formed on a surface of the substrate 50 using, for example, chemical vapor deposition (CVD), atomic layer deposition (ALD), physical vapor deposition (PVD), thermal oxidation, or the like.

A dopant-rich region 53 may then be formed in the substrate 50. The dopant-rich region 53 will be subsequently used to thin the substrate 50. The dopant-rich region 53 may be formed by implanting a dopant into the substrate 50. In some embodiments, the dopant-rich region 53 may be formed by implanting hydrogen or the like into the substrate 50. The dopant-rich region 53 may have an implant concentration from about $1 \times 10^{22}$ atoms/cm$^3$ to about $5 \times 10^{23}$ atoms/cm$^3$. The dopant-rich region 53 may be implanted using an implant dosage from about $1 \times 10^{16}$ atoms/cm$^2$ to about $5 \times 10^{17}$ atoms/cm$^2$ and may be performed at room temperature (e.g., from about 21° C. to about 25° C.).

In FIG. 2B, the first backside interconnect structure 166 is formed over the first carrier substrate 160. The first carrier substrate 160 may be a glass carrier substrate, a ceramic carrier substrate, a wafer (e.g., a silicon wafer), or the like. The first carrier substrate 160 may provide structural support during subsequent processing steps.

The first backside interconnect structure 166 is formed over the first carrier substrate 160. The first backside interconnect structure 166 may be referred to as a backside interconnect structure because it will be subsequently bonded to a backside of the substrate 50 (e.g., a side of the substrate 50 opposite the side of the substrate 50 on which active devices will be subsequently formed).

The first backside interconnect structure 166 may comprise one or more layers of first conductive features 164 formed in one or more stacked first dielectric layers 162. Each of the stacked first dielectric layers 162 may comprise a dielectric material, such as a low-k dielectric material, an extra low-k (ELK) dielectric material, or the like. The first dielectric layers 162 may be deposited using an appropriate process, such as, CVD, ALD, PVD, plasma-enhanced chemical vapor deposition (PECVD), or the like.

The first conductive features 164 may comprise conductive lines and conductive vias interconnecting the layers of conductive lines. The conductive vias may extend through respective ones of the first dielectric layers 162 to provide vertical connections between layers of the conductive lines. The first conductive features 164 may be formed through any acceptable process, such as, a damascene process, a dual damascene process, or the like.

In some embodiments, the first conductive features 164 may be formed using a damascene process in which a respective first dielectric layer 162 is patterned utilizing a combination of photolithography and etching techniques to form trenches corresponding to the desired pattern of the first conductive features 164. An optional diffusion barrier and/or optional adhesion layer may be deposited and the trenches may then be filled with a conductive material. Suitable materials for the barrier layer include titanium, titanium nitride, titanium oxide, tantalum, tantalum nitride, tantalum oxide, combinations thereof, or the like, and suitable materials for the conductive material include copper, silver, gold, tungsten, aluminum, ruthenium, cobalt, molybdenum, combinations thereof, or the like. In some embodiments, the first conductive features 164 may be deposited by front-end-of-line (FEOL) processes, which allows for high-temperature materials to be used for the conductive material. In an embodiment, the first conductive features 164 may be formed by depositing a seed layer of copper or a copper alloy, and filling the trenches by electroplating. A chemical mechanical planarization (CMP) process or the like may be used to remove excess conductive material from a surface of the respective first dielectric layer 162 and to planarize surfaces of the first dielectric layer 162 and the first conductive features 164 for subsequent processing.

In contrast to conventional processes which form backside interconnect structures over a substrate after thinning the substrate, the first conductive features 164 and the first dielectric layers 162 of the first backside interconnect structure 166 may be formed over the first carrier substrate 160 by FEOL processes. The first carrier substrate 160 may have better planarity as compared with thinned substrates, which allows for the first backside interconnect structure 166 to be formed with smaller critical dimensions and improved overlay control. For example, the conductive lines of the first conductive features 164 may have pitches from about 15 nm to about 50 nm, widths from about 8 nm to about 35 nm, and thicknesses from about 10 nm to about 40 nm. The conductive vias of the first conductive features 164 may have critical dimensions from about 8 nm to about 35 nm and heights from about 10 nm to about 30 nm. Forming the features of the first backside interconnect structure 166 with smaller critical dimensions reduces device area and improves device density and improving overlay control reduces device defects.

FIG. 2B illustrates three layers of the first conductive features 164 and four layers of the first dielectric layers 162 in the first backside interconnect structure 166. However, it should be appreciated that the first backside interconnect structure 166 may comprise any number of first conductive features 164 disposed in any number of first dielectric layers 162. The first backside interconnect structure 166 may be electrically connected to subsequently formed source/drain regions (such as the epitaxial source/drain regions 92, discussed below with respect to FIGS. 17A through 17D) to form functional circuits. In some embodiments, the functional circuits formed by the first backside interconnect structure 166 may comprise logic circuits, memory circuits, image sensor circuits, or the like.

Further in FIG. 2B, a second dielectric layer 168 is formed over the first backside interconnect structure 166. The second dielectric layer 168 may comprise silicon oxide, silicon nitride (SiN), silicon carbonitride (SiCN), silicon oxycarbonitride (SiOCN), combinations or multiple layers thereof, or the like. The second dielectric layer 168 may be formed on a surface of the first backside interconnect structure 166 using, for example, CVD, ALD, PVD, or the like. The second dielectric layer 168 will be subsequently used to bond the first backside interconnect structure 166 to the substrate 50.

Figure 3:
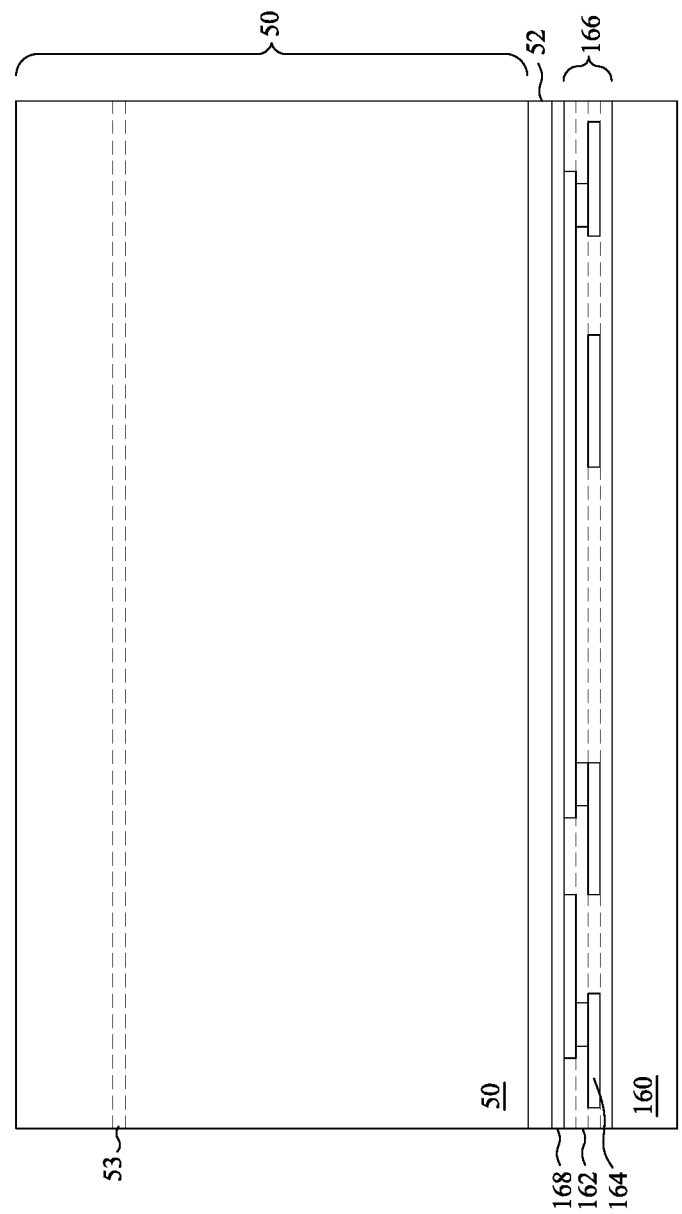

In FIG. 3, the substrate 50 is flipped and the second dielectric layer 168 is bonded to the first bonding layer 52. In various embodiments, the second dielectric layer 168 may be bonded to the first bonding layer 52 using a suitable technique, such as dielectric-to-dielectric bonding, or the like. The dielectric-to-dielectric bonding process may include applying a surface treatment to one or more of the second dielectric layer 168 and the first bonding layer 52. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the second dielectric layer 168 and the first bonding layer 52. The first backside interconnect structure 166 is then aligned with the substrate 50 and the two are pressed against each other to initiate a pre-bonding of the second dielectric layer 168 to the first bonding layer 52. The pre-bonding may be performed at room temperature (e.g., from about 21° C. to about 25° C.). After the pre-bonding, an annealing process may be applied by, for example, heating the first backside interconnect structure 166, the second dielectric layer 168, the first bonding layer 52, and the substrate 50 to a temperature of about 170° C.

Figure 4:
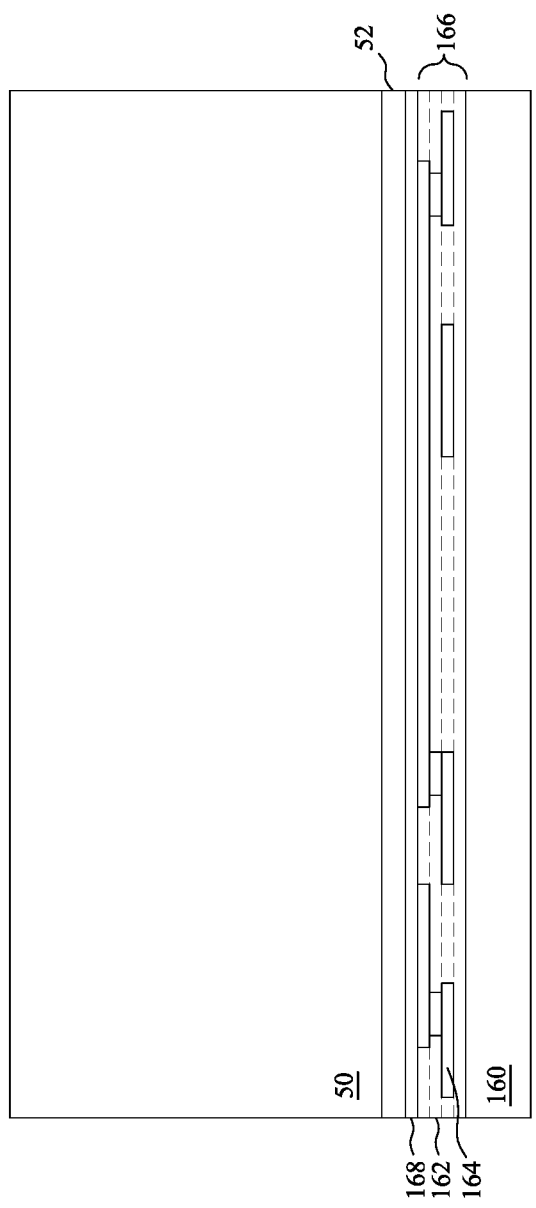

In FIG. 4, the substrate 50 is thinned. The substrate 50 may be thinned along the dopant-rich region 53. The substrate 50 may be thinned by performing a thermal process on the substrate 50 to form a blister or bubble layer in the dopant-rich region 53, then breaking the substrate 50 along the blister layer. The thermal process may be performed by heating the substrate 50 to a temperature from about 400° C. to about 1,200° C. for a period ranging from about 1 hour to about 12 hours. After the substrate 50 is broken, a planarization process, such as a mechanical grinding, a CMP, or the like, may be used to planarize a surface of the substrate 50.

Figure 5:
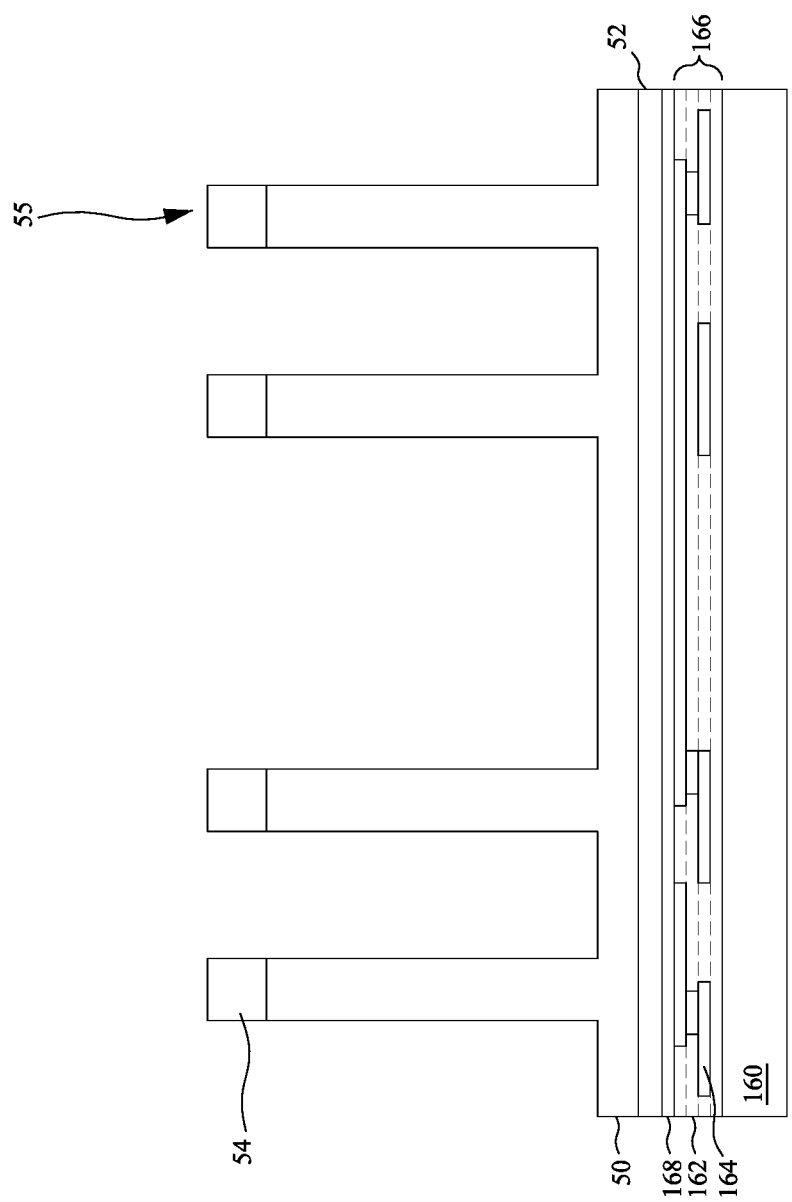

In FIG. 5, first patterned hard masks 54 are formed over the substrate 50 and fins 55 are formed in the substrate 50. The first patterned hard masks 54 may be formed by depositing a first hard mask layer over the substrate 50 patterning the first hard mask layer using a lithography process to form the first patterned hard masks 54. The first hard mask layer may be deposited by CVD, ALD, or the like. The first hard mask layer may be formed of silicon oxide, silicon nitride, silicon carbide, amorphous silicon, titanium nitride, silicon oxynitride, silicon carbonitride, combinations or multiple layers thereof, or the like.

A first patterned mask (not separately illustrated), such as a patterned photoresist, may be formed over the first hard mask layer. The first patterned mask may be formed by depositing a first photosensitive layer over the first hard mask layer using spin-on coating or the like. The first photosensitive layer may then be patterned by exposing the first photosensitive layer to a patterned energy source (e.g., a patterned light source) and developing the first photosensitive layer to remove an exposed or unexposed portion of the first photosensitive layer, thereby forming the first patterned mask. The first hard mask layer may be etched by a suitable etching process, such as reactive ion etching (RIE), neutral beam etching (NBE), the like, or a combination thereof in order to transfer the pattern of the first patterned mask to the first hard mask layer, forming the first patterned hard masks 54. In some embodiments, the etching process may be anisotropic. The first patterned mask may then be removed by any acceptable process, such as an ashing process, a stripping process, the like, or a combination thereof.

The fins 55 may then be etched in the substrate 50 using the first patterned hard masks 54 as masks. The fins 55 are semiconductor strips. In some embodiments, the fins 55 may be formed in the substrate 50 by etching trenches in the substrate 50. The etching may be any acceptable etch process, such as a RIE, NBE, the like, or a combination thereof. The etch may be anisotropic.

The fins 55 may be patterned by any suitable method. For example, the fins 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 55.

Figure 6:
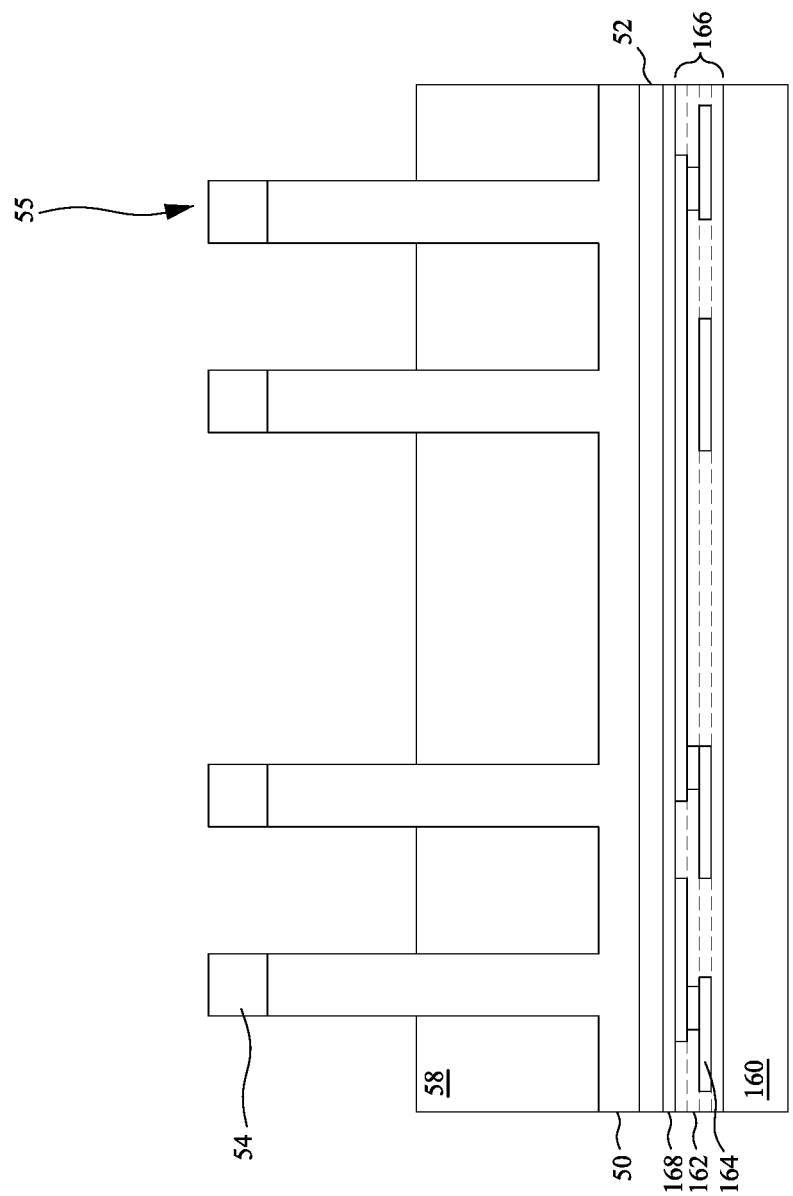

In FIG. 6, shallow trench isolation (STI) regions 58 are formed adjacent the fins 55. The STI regions 58 may be formed by depositing an insulation material over the substrate 50, the fins 55, and the first patterned hard masks 54, and between adjacent fins 55. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the fins 55 and the first patterned hard masks 54. Although the insulation material is illustrated as a single layer, some embodiments may utilize multiple layers. For example, in some embodiments a liner (not separately illustrated) may first be formed along surfaces of the substrate 50, the fins 55, and the first patterned hard masks 54. Thereafter, a fill material, such as those discussed above may be formed over the liner.

A removal process is then applied to the insulation material to remove excess insulation material over the fins 55 and the first patterned hard masks 54. In some embodiments, a planarization process such as a chemical mechanical polish (CMP), an etch-back process, combinations thereof, or the like may be utilized. The planarization process exposes the first patterned hard masks 54 such that top surfaces of the first patterned hard masks 54 and the insulation material are level after the planarization process is complete.

The insulation material is then recessed to form the STI regions 58. The insulation material is recessed such that the first patterned hard masks 54 and upper portions of the fins 55 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the fins 55 and the first patterned hard masks 54). For example, an oxide removal using, for example, dilute hydrofluoric acid (dHF) may be used.

The process described with respect to FIGS. 5 and 6 is just one example of how the fins 55 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 55. Additionally, in some embodiments, heteroepitaxial structures can be used for the fins 55. For example, fins formed in the isolation material can be recessed, and a material different from the fins may be epitaxially grown over the recessed fins. In such embodiments, the fins 55 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region (e.g., an NMOS region) different from the material in the p-type region (e.g., a PMOS region). In various embodiments, upper portions of the fins 55 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not separately illustrated) may be formed in the fins 55 and/or the substrate 50. In some embodiments, a P well may be formed in the n-type region, and an N well may be formed in the p-type region. In some embodiments, a P well or an N well are formed in both the n-type region and the p-type region.

In the embodiments with different well types, the different implant steps for the n-type region and the p-type region may be achieved using a photoresist and/or other masks (not separately illustrated). For example, a photoresist may be formed over the fins 55 and the STI regions 58 in the n-type region. The photoresist is patterned to expose the p-type region of the substrate 50. The photoresist can be formed by using a spin-on technique and can be patterned using acceptable photolithography techniques. Once the photoresist is patterned, an n-type impurity implant is performed in the p-type region, and the photoresist may act as a mask to substantially prevent n-type impurities from being implanted into the n-type region. The n-type impurities may be phosphorus, arsenic, antimony, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist is removed, such as by an acceptable ashing process.

Following the implanting of the p-type region, a photoresist is formed over the fins 55 and the STI regions 58 in the p-type region. The photoresist is patterned to expose the n-type region of the substrate 50. The photoresist can be formed by using a spin-on technique and can be patterned using acceptable photolithography techniques. Once the photoresist is patterned, a p-type impurity implant may be performed in the n-type region, and the photoresist may act as a mask to substantially prevent p-type impurities from being implanted into the p-type region. The p-type impurities may be boron, boron fluoride, indium, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist may be removed, such as by an acceptable ashing process.

After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
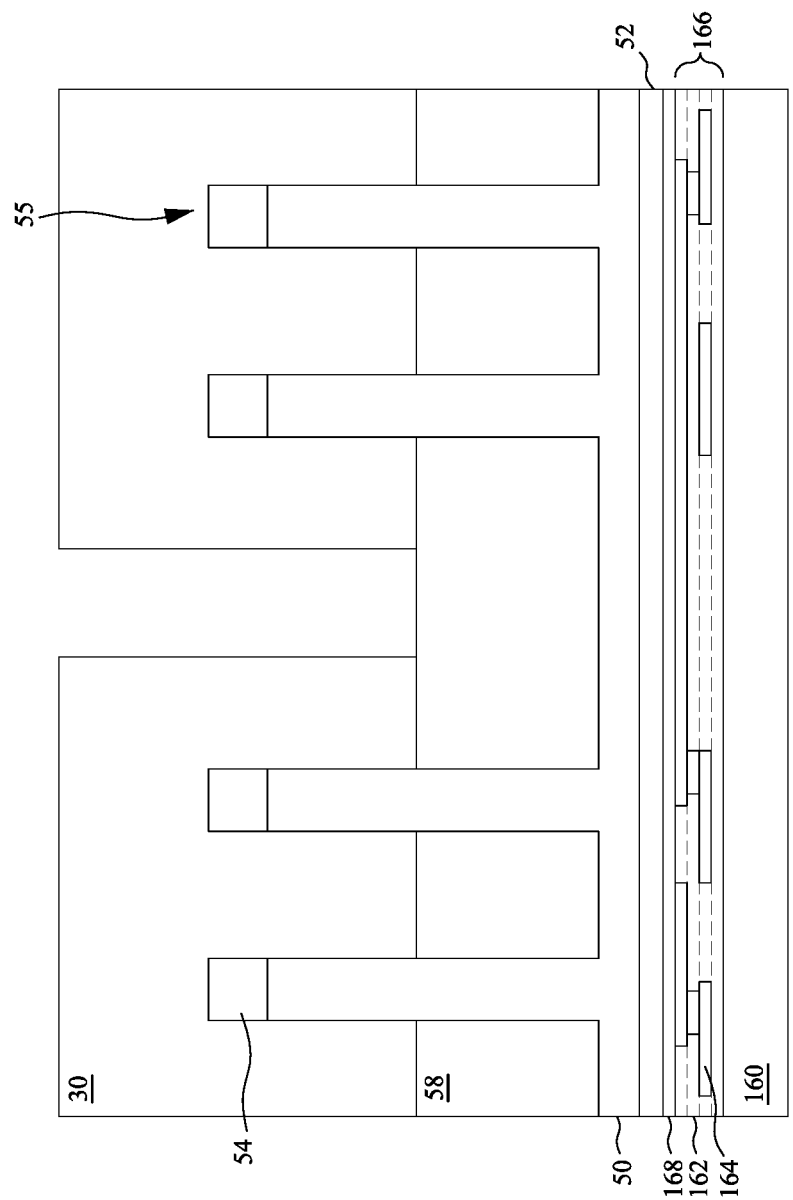

In FIG. 7, a second patterned mask 30, such as a patterned photoresist, is formed over the fins 55, the first patterned hard masks 54, and the STI regions 58. The second patterned mask 30 may be formed by depositing a second photosensitive layer over the fins 55, the first patterned hard masks 54, and the STI regions 58 using spin-on coating or the like. The second photosensitive layer may then be patterned by exposing the second photosensitive layer to a patterned energy source (e.g., a patterned light source) and developing the second photosensitive layer to remove an exposed or unexposed portion of the second photosensitive layer, thereby forming the second patterned mask 30.

Figure 8:
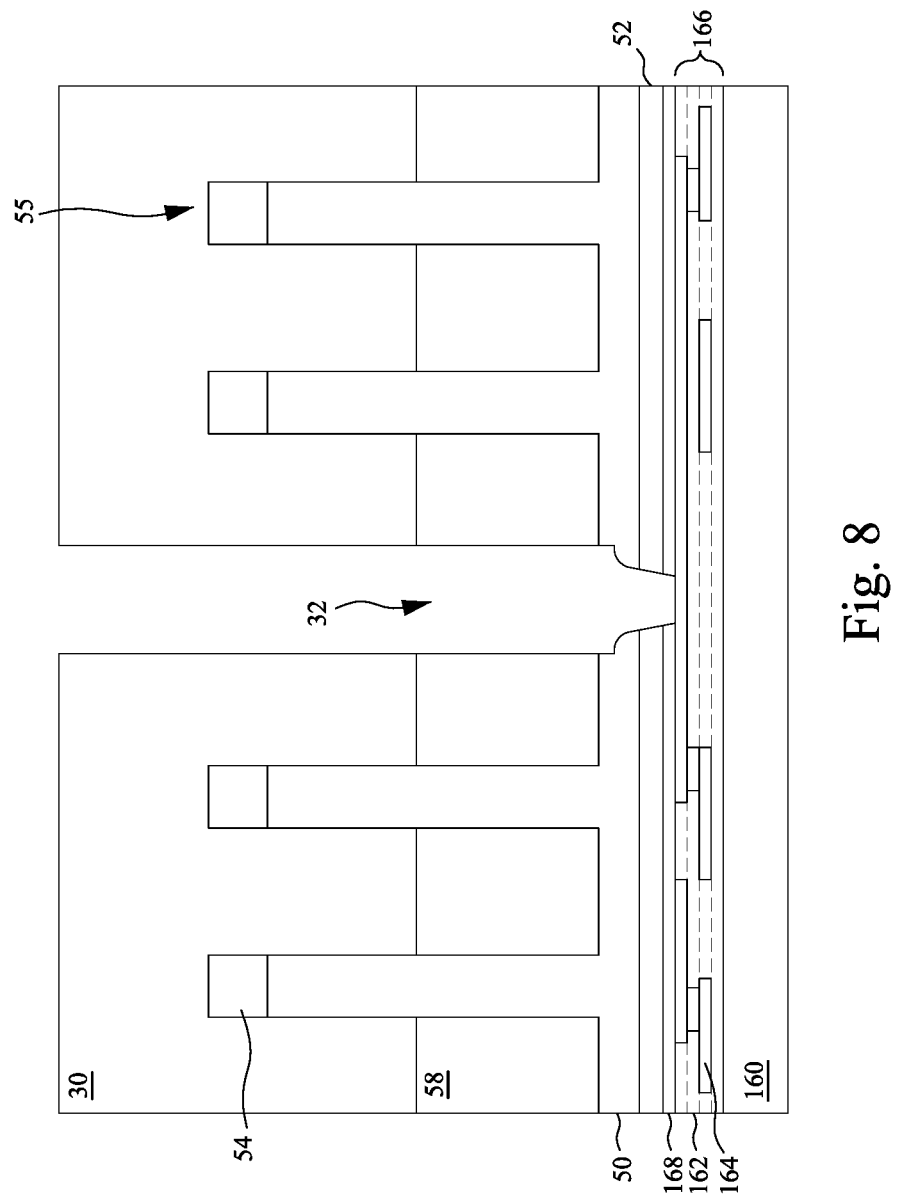

In FIG. 8, first openings 32 are formed in the STI regions 58, the substrate 50, the first bonding layer 52, and the second dielectric layer 168 to expose first conductive features 164 in the first backside interconnect structure 166. The substrate 50, the first bonding layer 52, and the second dielectric layer 168 may be etched by a suitable etching process, such as RIE, NBE, the like, or a combination thereof, using the second patterned mask 30 as a mask in order to form the first openings 32. In some embodiments, the etching process may be anisotropic. The first conductive features 164 may act as an etch stop for the etching process. As illustrated in FIG. 8, the first openings 32 may be formed between adjacent pairs of the fins 55.

Figure 9:
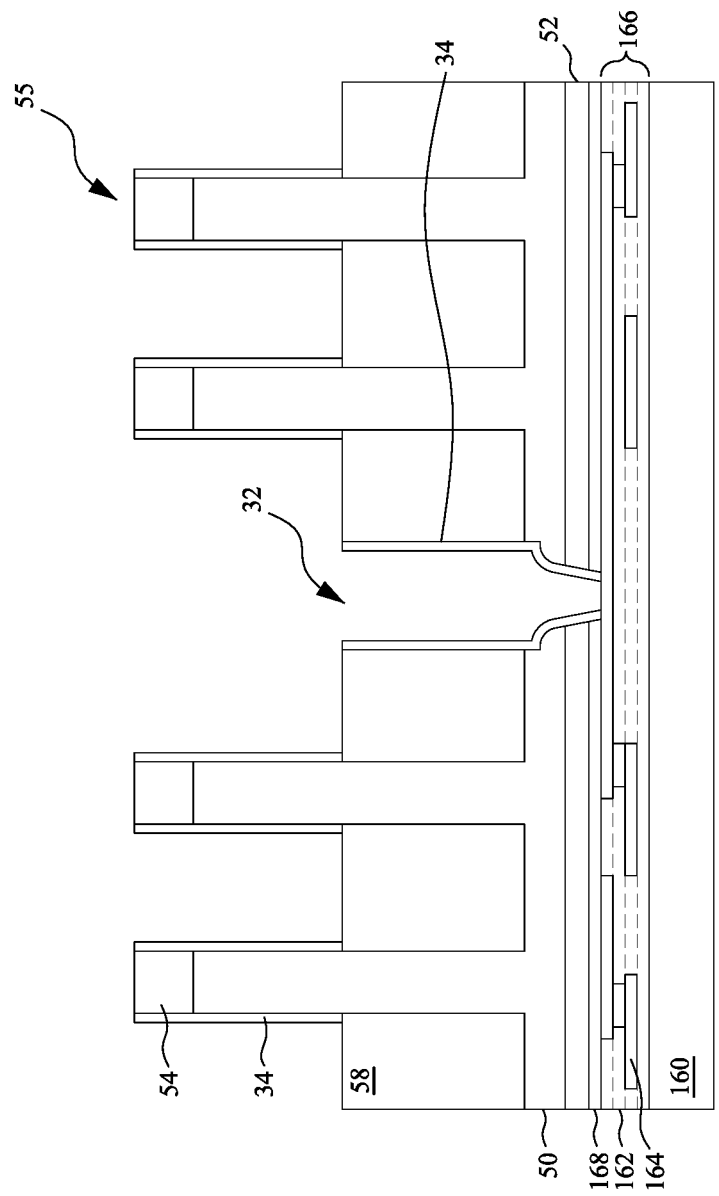

In FIG. 9, the second patterned mask 30 is removed and first liners 34 are formed along exposed sidewalls of the STI regions 58, the substrate 50, the first bonding layer 52, the second dielectric layer 168, the fins 55, and the first patterned hard masks 54. The second patterned mask 30 may be removed by any acceptable process, such as an ashing process, a stripping process, the like, or a combination thereof.

The first liners 34 may be formed by forming a first liner layer (not separately illustrated) over exposed top surfaces and sidewalls of the first patterned hard masks 54 and the STI regions 58 and over exposed sidewalls of the fins 55, the substrate 50, the first bonding layer 52, the second dielectric layer 168 and exposed top surfaces of the first conductive features 164. The first liner layer may be formed of as silicon oxide, silicon nitride, silicon oxynitride, or the like. The first liner layer may be deposited by CVD, ALD, or the like. The first liner layer may then be etched using suitable etching processes, such as isotropic etching processes (e.g., wet etching processes), anisotropic etching processes (e.g., dry etching processes), multiple processes or combinations thereof, or the like, to form the first liners 34. In some embodiments, the first liner layer may be etched by an anisotropic etching process such that the first liners 34 remain along sidewalls of the STI regions 58, the substrate 50, the first bonding layer 52, the second dielectric layer 168, the fins 55, and the first patterned hard masks 54. The first liners 34 may act as isolation features between subsequently formed backside vias (such as the backside vias 36, discussed below with respect to FIG. 10) and the substrate 50.

Figure 10:
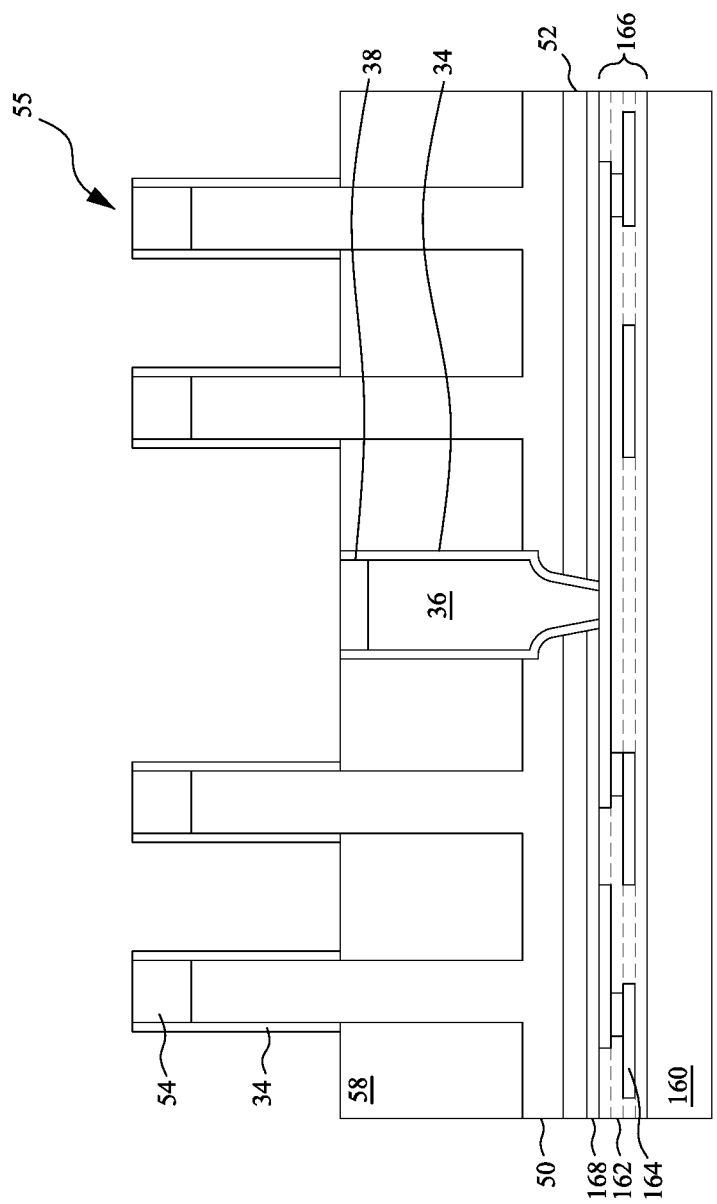

In FIG. 10, backside vias 36 and third dielectric layers 38 are formed in the first openings 32 (see FIG. 9). The backside vias 36 may extend at least partially through the STI regions 58, through the substrate 50, through the first bonding layer 52, and through the second dielectric layer 168 and may be electrically coupled to the first conductive features 164 of the first backside interconnect structure 166. The backside vias 36 may each comprise one or more layers, such as barrier layers, diffusion layers, and fill materials. For example, in some embodiments, the backside vias 36 each include a barrier layer and a conductive material. The barrier layer may include titanium, titanium nitride, tantalum, tantalum nitride, or the like. The conductive material may be copper, a copper alloy, silver, gold, tungsten, cobalt, aluminum, nickel, ruthenium, molybdenum, or the like. The backside vias 36 may be formed using, for example, CVD, ALD, PVD, plating or the like. As illustrated in FIG. 10, the backside vias 36 may be formed between adjacent pairs of the fins 55.

In some embodiments, the backside vias 36 are power rails, which are conductive lines that electrically connect subsequently formed source/drain regions (such as the epitaxial source/drain regions 92, discussed below with respect to FIGS. 17A through 17D) to a reference voltage, supply voltage, or the like. By placing power rails on a backside of the resulting semiconductor die rather than in a front side of the semiconductor die, advantages may be achieved. For example, a gate density of the FinFETs and/or interconnect density of interconnect structures may be increased. Further, the backside of the semiconductor die may accommodate wider power rails, reducing resistance and increasing efficiency of power delivery to the FinFETs. For example, a width of the backside vias 36 may be at least twice a width of a first level conductive line (such as the second conductive features 122 of the front-side interconnect structure 120, discussed below with respect to FIGS. 27A through 27C).

The backside vias 36 may be etched back and the third dielectric layers 38 may be formed over the backside vias 36. The backside vias 36 may be etched using suitable etching processes, such as isotropic etching processes (e.g., wet etching processes), anisotropic etching processes (e.g., dry etching processes), multiple processes or combinations thereof, or the like, to form recesses. The third dielectric layers 38 may then be filled in the recesses. The third dielectric layers 38 may be substantially similar to the STI regions 58 described above. For example, the third dielectric layers 38 may be formed of like materials and using like processes as the STI regions 58.

Figure 11:
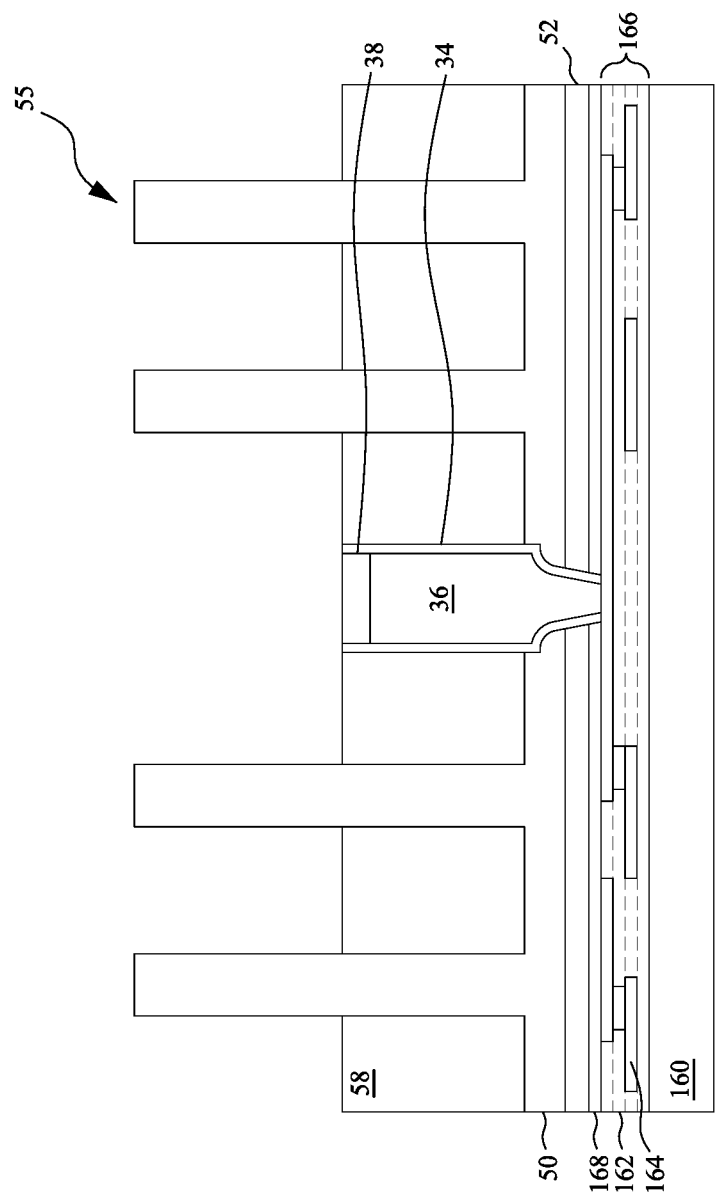

In FIG. 11, the first patterned hard masks 54 and the first liners 34 disposed on sidewalls of the fins 55 are removed. The first patterned hard masks 54 and the first liners 34 may be etched using suitable etching processes, such as isotropic etching processes (e.g., wet etching processes), anisotropic etching processes (e.g., dry etching processes), multiple processes or combinations thereof, or the like. In some embodiments, the first patterned hard masks 54 may be removed by a planarization process, such as mechanical grinding, CMP, or the like, and the first liners 34 may then be removed using the etching processes.

Figure 12:
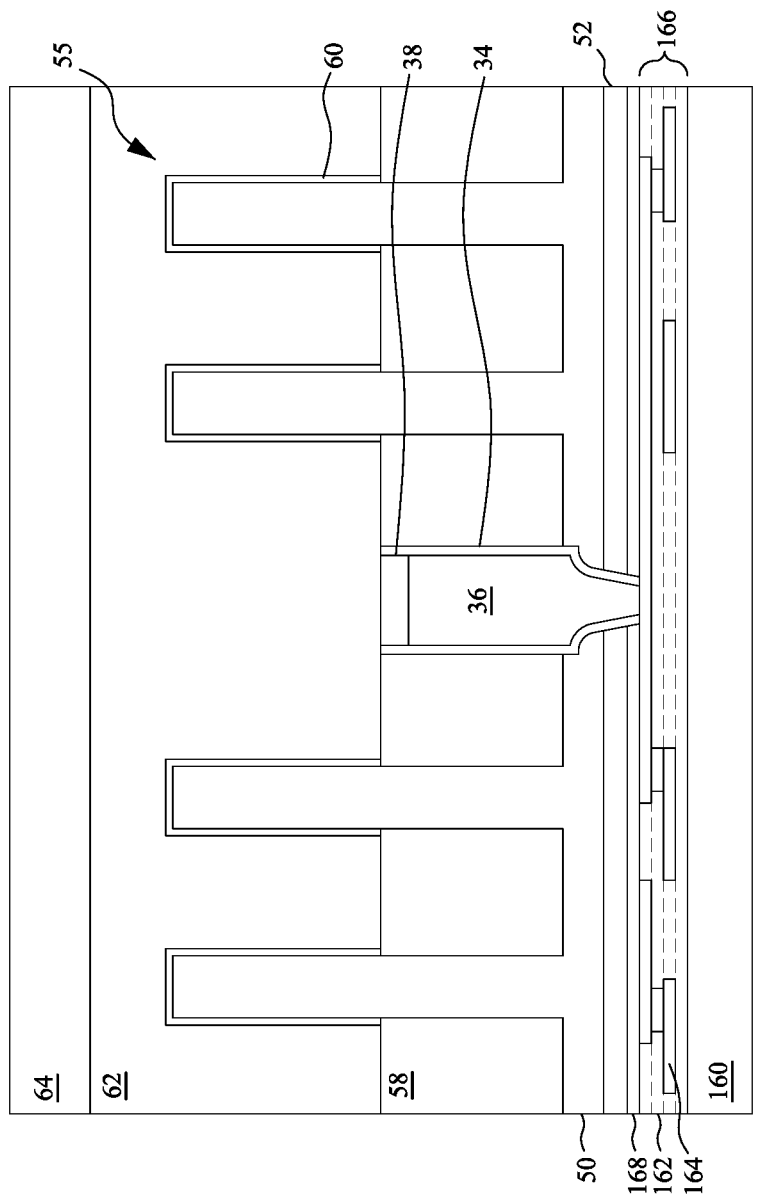

In FIG. 12, a dummy dielectric layer 60 is formed on the fins 55. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by PVD, CVD, sputter deposition, or other techniques for depositing the selected material. The dummy gate layer 62 may be made of other materials that have a high etching selectivity from the etching of the STI regions 58. The mask layer 64 may include, for example, silicon nitride, silicon oxynitride, or the like. In some embodiments, a single dummy gate layer 62 and a single mask layer 64 are formed across the n-type region and the p-type region. It is noted that the dummy dielectric layer 60 is shown covering only the fins 55 for illustrative purposes only. In some embodiments, the dummy dielectric layer 60 may be deposited such that the dummy dielectric layer 60 covers the STI regions 58, such that the dummy dielectric layer 60 extends between the dummy gate layer 62 and the STI regions 58.

FIGS. 13A through 31C illustrate various additional steps in the manufacturing of embodiment devices. FIGS. 13A through 31C illustrate features in either of the n-type region or the p-type region. For example, the structures illustrated in FIGS. 13A through 31C may be applicable to both the n-type region and the p-type region. Differences (if any) in the structures of the n-type region and the p-type region are described in the text accompanying each figure.

Figure 13B:
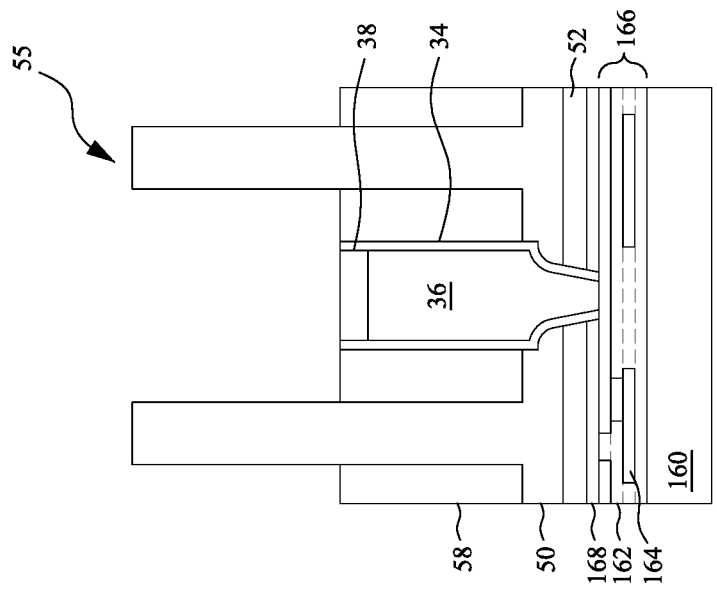
Figure 13A:
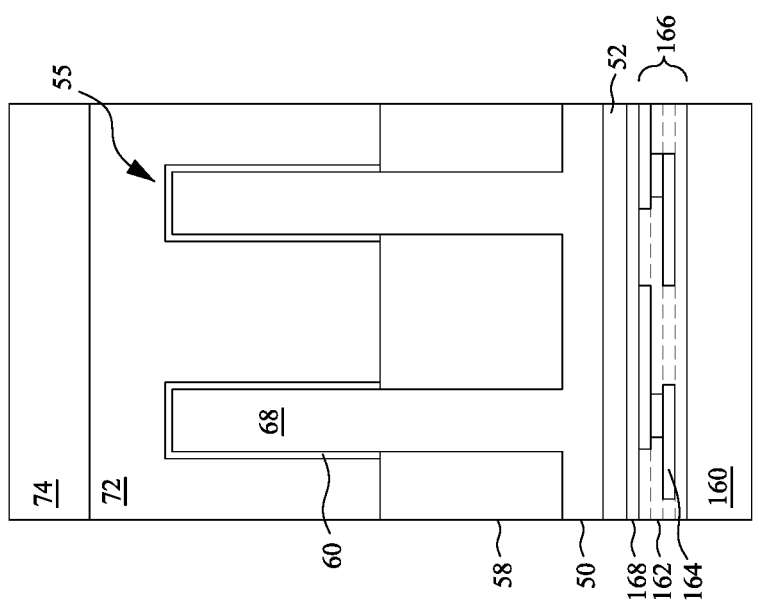
Figure 13C:
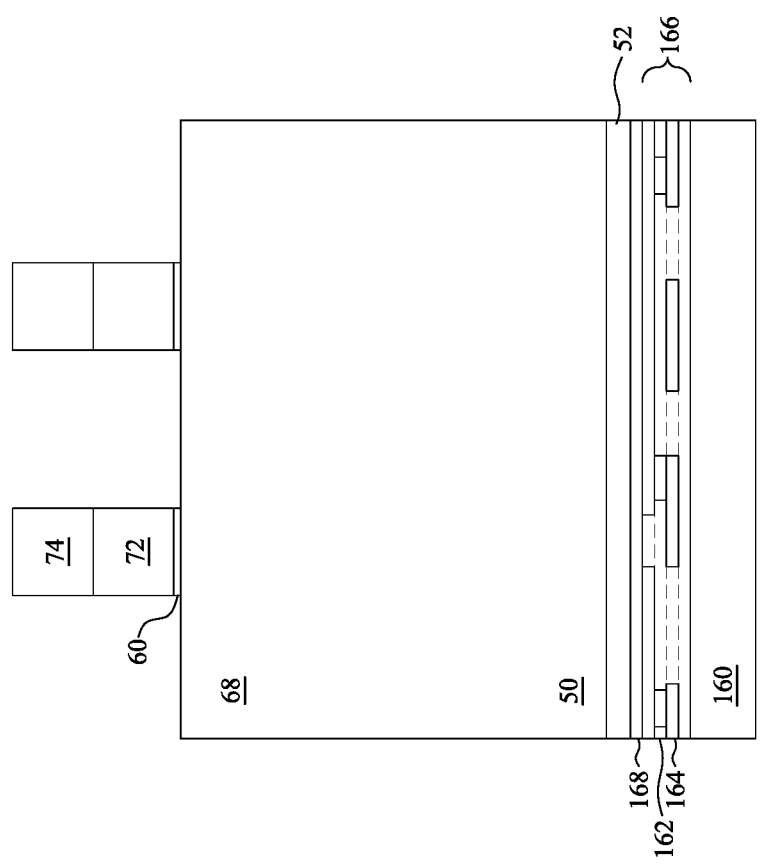

In FIGS. 13A through 13C, the mask layer 64 (see FIG. 7) may be patterned using acceptable photolithography and etching techniques to form masks 74. The pattern of the masks 74 then may be transferred to the dummy gate layer 62 by a suitable etching process to form dummy gates 72. In some embodiments (not separately illustrated), the pattern of the masks 74 may also be transferred to the dummy dielectric layer 60. The dummy gates 72 cover respective channel regions 68 of the fins 55. The pattern of the masks 74 may be used to physically separate each of the dummy gates 72 from adjacent dummy gates 72. The dummy gates 72 may also have a lengthwise direction substantially perpendicular to the lengthwise direction of respective fins 55.

Figure 14B:
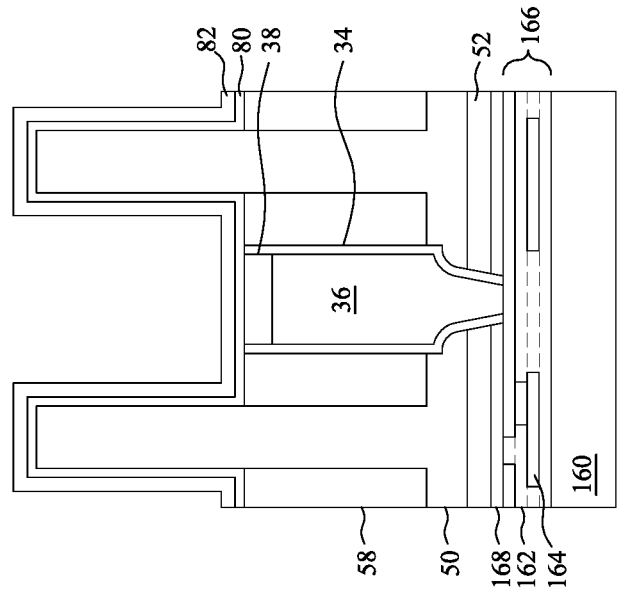
Figure 14A:
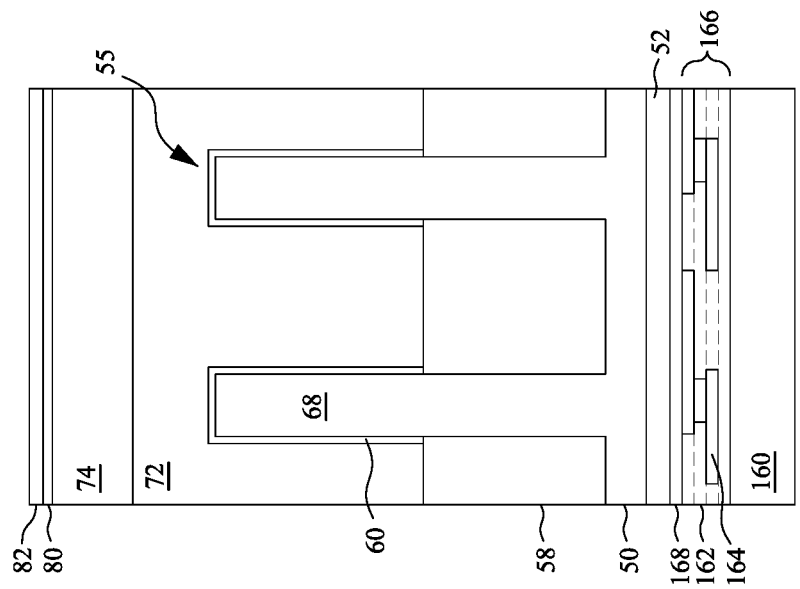
Figure 14C:
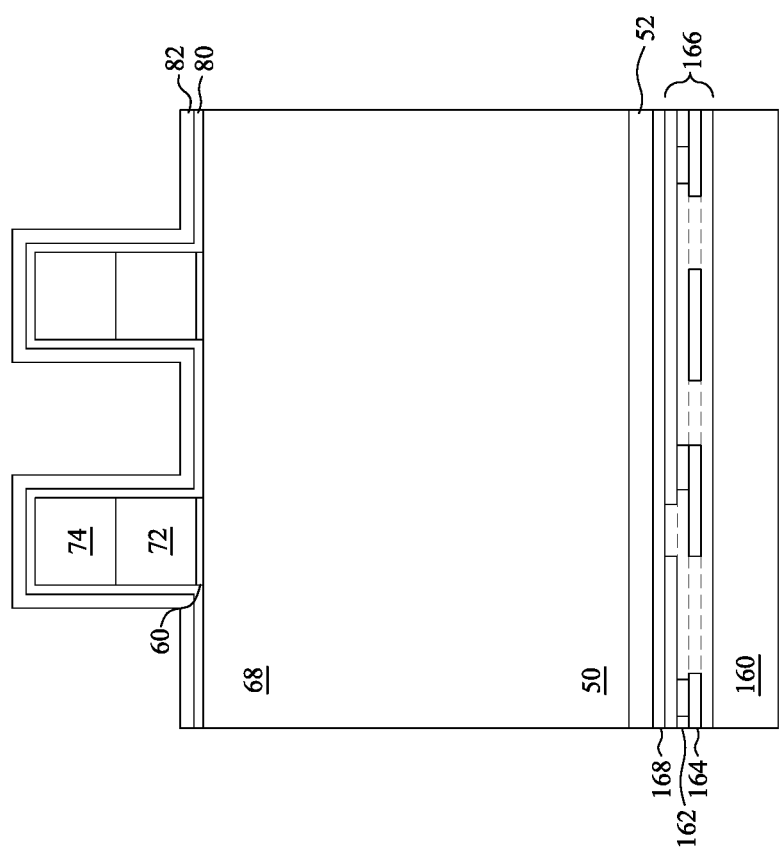

In FIGS. 14A through 14C, a first spacer layer 80 and a second spacer layer 82 are formed over the structures illustrated in FIGS. 13A through 13C. The first spacer layer 80 and the second spacer layer 82 will be subsequently patterned to act as spacers for forming self-aligned source/drain regions. In FIGS. 14A through 14C, the first spacer layer 80 is formed on top surfaces of the STI regions 58 and the third dielectric layers 38; top surfaces and sidewalls of the fins 55 and the masks 74; and sidewalls of the dummy gates 72 and the dummy dielectric layer 60. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 6, a mask, such as a photoresist, may be formed over the n-type region, while exposing the p-type region, and appropriate type (e.g., p-type) impurities may be implanted into the exposed fins 55 in the p-type region. The mask may then be removed. Subsequently, a mask, such as a photoresist, may be formed over the p-type region while exposing the n-type region, and appropriate type impurities (e.g., n-type) may be implanted into the exposed fins 55 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 15B:
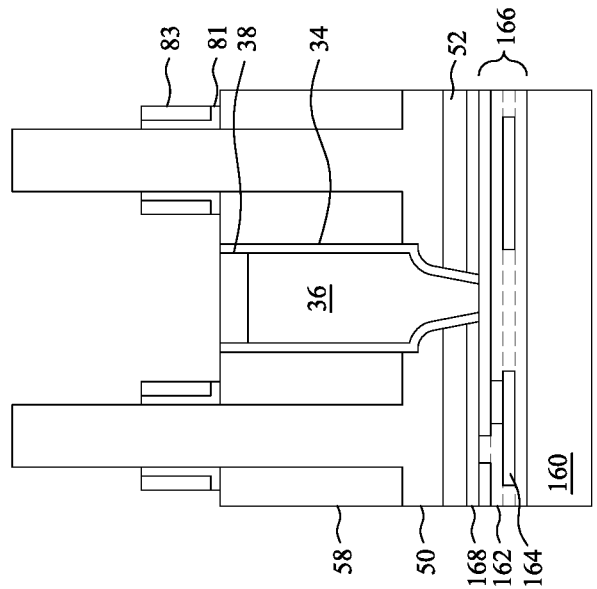
Figure 15A:
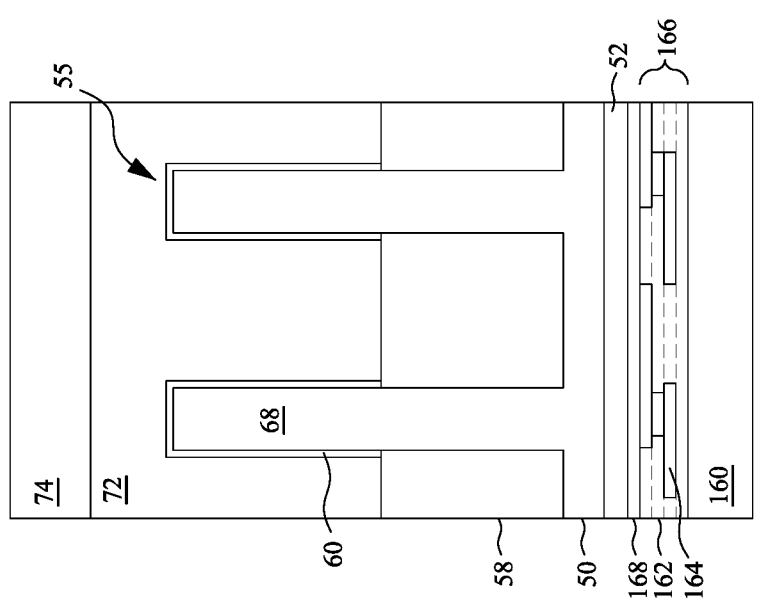
Figure 15C:
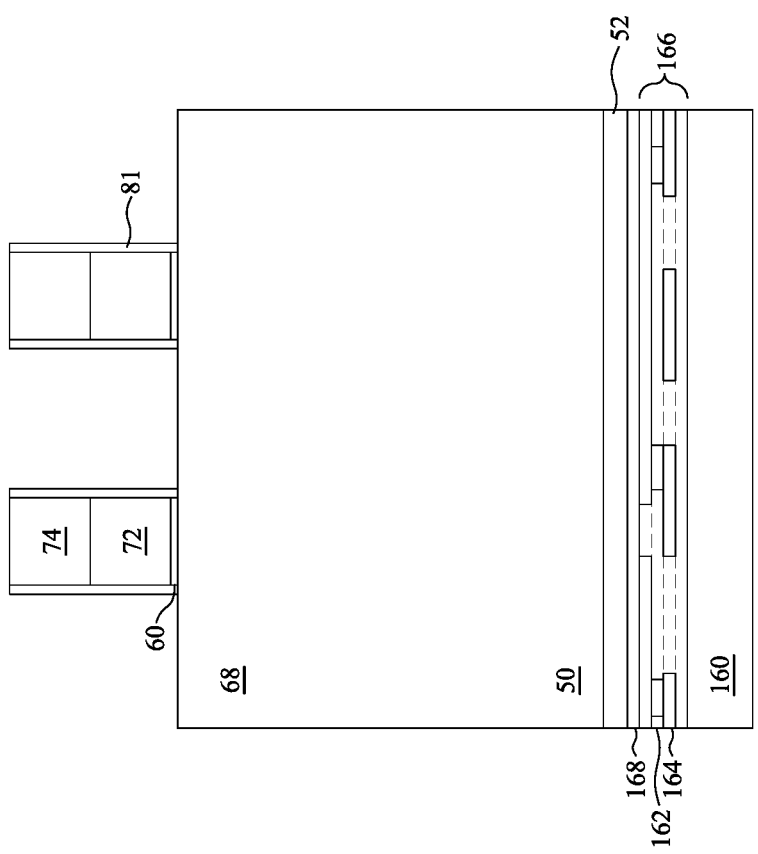

In FIGS. 15A through 15C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 15B. Thereafter, the second spacers 83 acts as a mask while etching exposed portions of the first spacer layer 80, thereby forming first spacers 81 as illustrated in FIGS. 15B and 15C.

As illustrated in FIG. 15B, the first spacers 81 and the second spacers 83 are disposed on sidewalls of the fins 55. As illustrated in FIG. 15C, in some embodiments, the second spacer layer 82 may be removed from over the first spacer layer 80 adjacent the masks 74, the dummy gates 72, and the dummy dielectric layer 60, and the first spacers 81 are disposed on sidewalls of the masks 74, the dummy gates 72, and the dummy dielectric layer 60. In other embodiments, a portion of the second spacer layer 82 may remain over the first spacer layer 80 adjacent the masks 74, the dummy gates 72, and the dummy dielectric layer 60.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 16B:
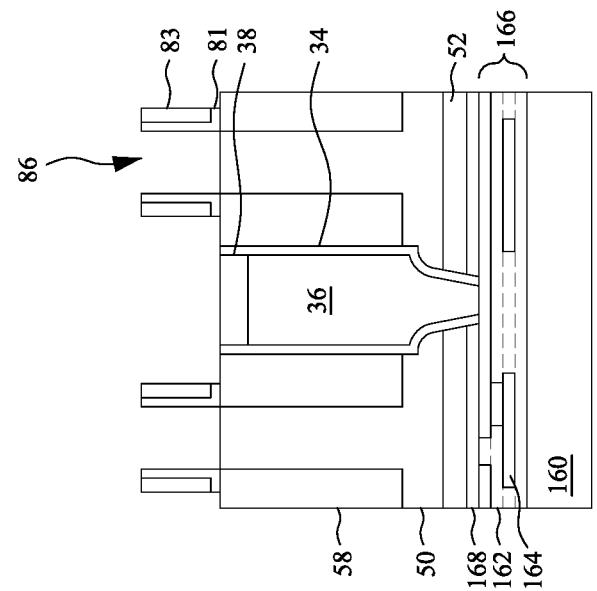
Figure 16A:
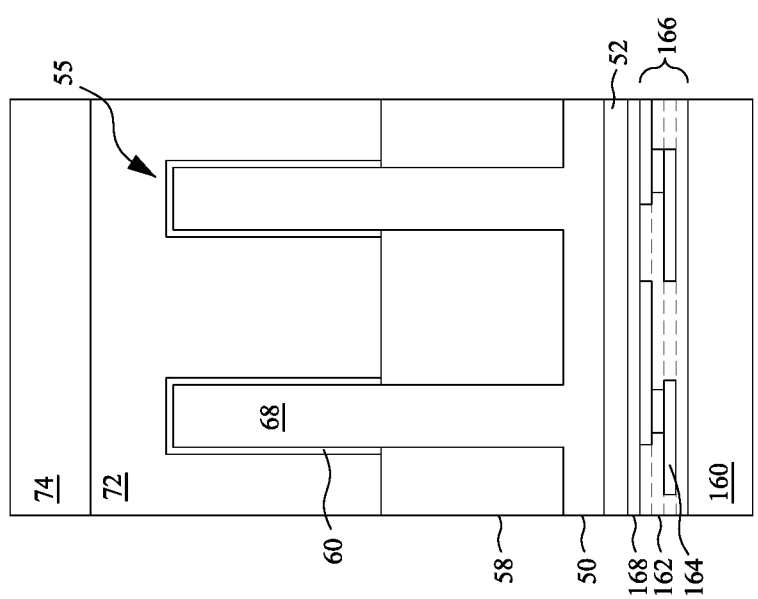
Figure 16C:
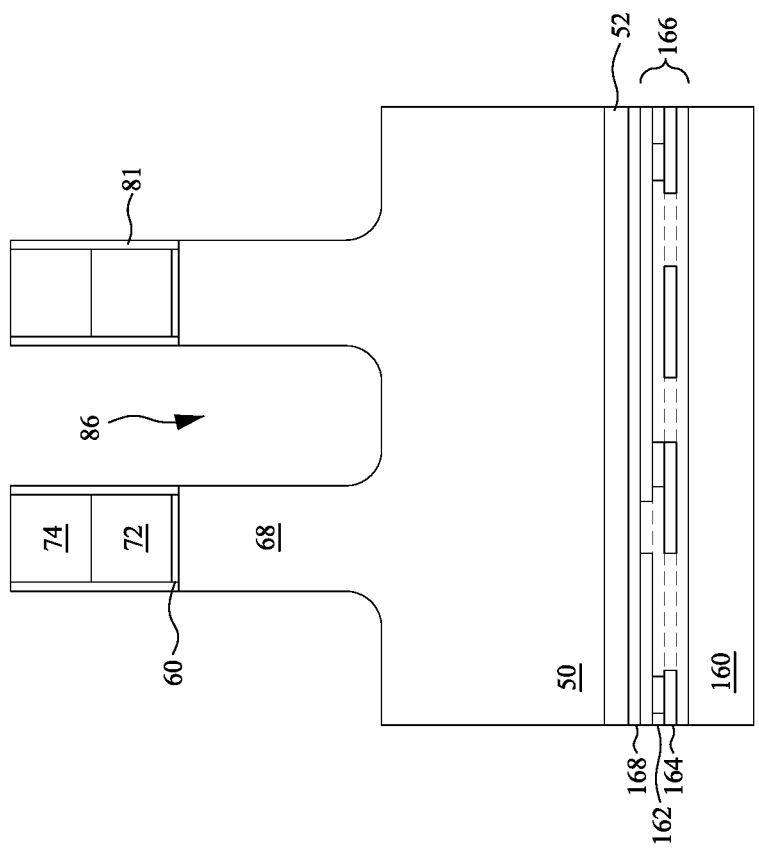

In FIGS. 16A through 16C, first recesses 86 are formed in the fins 55 and the substrate 50, in accordance with some embodiments. Epitaxial source/drain regions will be subsequently formed in the first recesses 86. The first recesses 86 may extend through the fins 55 and into the substrate 50. As illustrated in FIG. 15B, top surfaces of the STI regions 58 may be level with bottom surfaces of the first recesses 86. In various embodiments, the fins 55 may be etched such that bottom surfaces of the first recesses 86 are disposed above or below the top surfaces of the STI regions 58.

The first recesses 86 may be formed by etching the fins 55 and the substrate 50 using anisotropic etching processes, such as RIE, NBE, or the like. The first spacers 81, the second spacers 83, and the masks 74 mask portions of the fins 55 and the substrate 50 during the etching processes used to form the first recesses 86. A single etch process or multiple etch processes may be used to etch the fins 55 and the substrate 50. Timed etch processes may be used to stop the etching after the first recesses 86 reach desired depths.

Figure 17B:
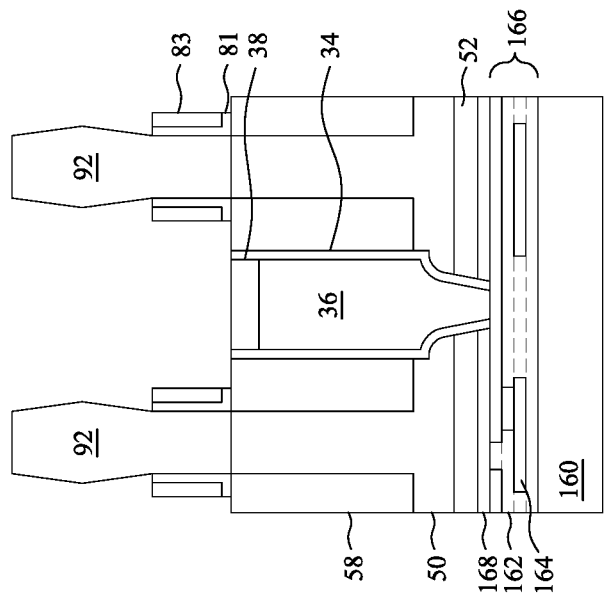
Figure 17A:
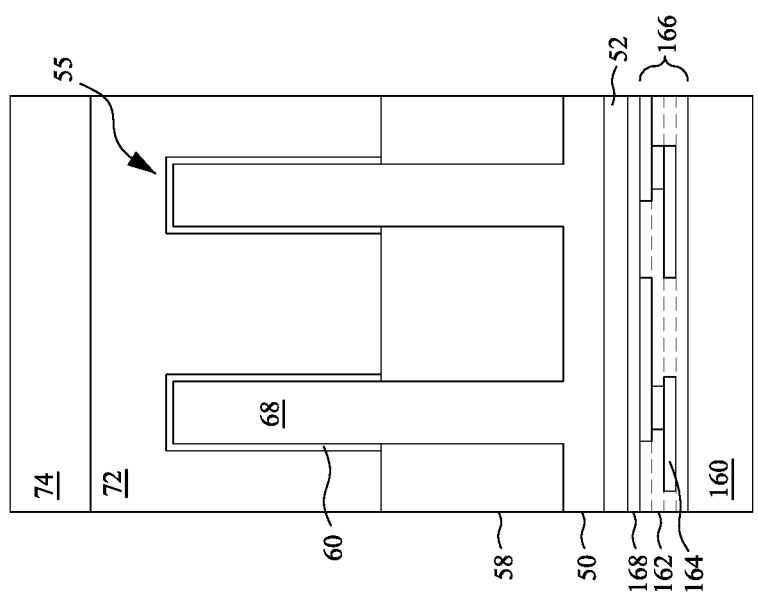
Figure 17D:
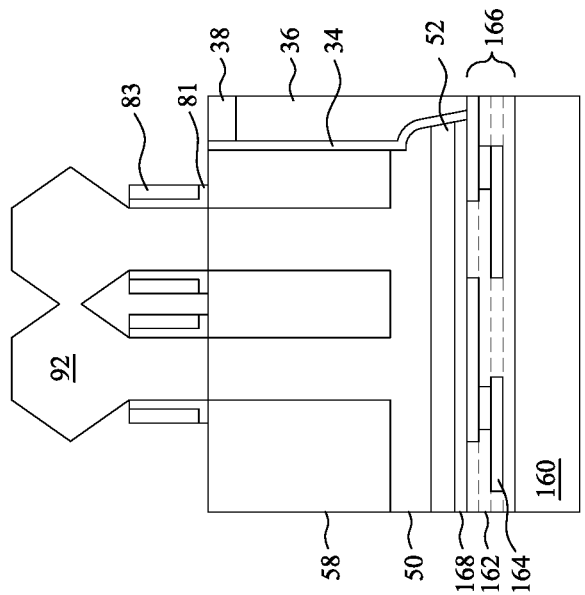
Figure 17C:
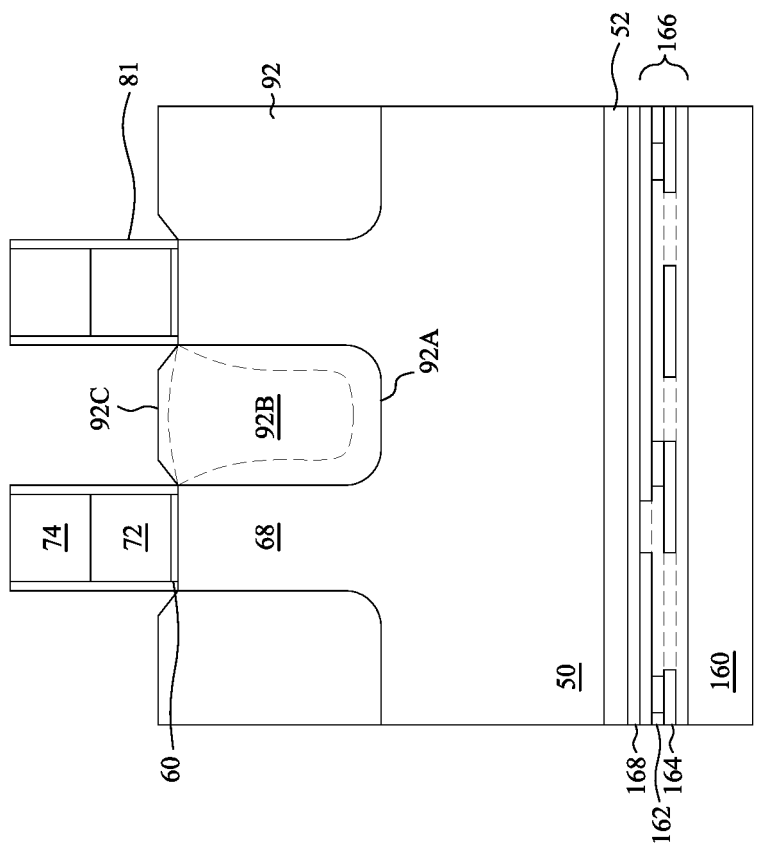

In FIGS. 17A through 17D, epitaxial source/drain regions 92 are formed in the first recesses 86. The epitaxial source/drain regions 92 may be epitaxially grown in the first recesses 86 using a process such as CVD, ALD, vapor phase epitaxy (VPE), molecular beam epitaxy (MBE), or the like. In some embodiments, the epitaxial source/drain regions 92 may exert stress on the fins 55, thereby improving performance. As illustrated in FIG. 17C, the epitaxial source/drain regions 92 are formed in the first recesses 86 such that each dummy gate 72 is disposed between respective neighboring pairs of the epitaxial source/drain regions 92. In some embodiments, the first spacers 81 are used to separate the epitaxial source/drain regions 92 from the dummy gates 72 so that the epitaxial source/drain regions 92 do not short out with subsequently formed gates of the resulting FinFETs.

The epitaxial source/drain regions 92 in the n-type region, e.g., the NMOS region, may be formed by masking the p-type region, e.g., the PMOS region. Then, the epitaxial source/drain regions 92 are epitaxially grown in the first recesses 86 in the n-type region. The epitaxial source/drain regions 92 may include any acceptable material appropriate for n-type FinFETs. For example, if the fins 55 are silicon, the epitaxial source/drain regions 92 may include materials exerting a tensile strain on the fins 55, such as silicon, silicon carbide, phosphorous doped silicon carbide, silicon phosphide, or the like. The epitaxial source/drain regions 92 may have surfaces raised from respective upper surfaces of the fins 55 and may have facets.

The epitaxial source/drain regions 92 in the p-type region, e.g., the PMOS region, may be formed by masking the n-type region, e.g., the NMOS region. Then, the epitaxial source/drain regions 92 are epitaxially grown in the first recesses 86 in the p-type region. The epitaxial source/drain regions 92 may include any acceptable material appropriate for p-type FinFETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region and the p-type region, upper surfaces of the epitaxial source/drain regions 92 have facets which expand laterally outward beyond sidewalls of the fins 55. In some embodiments, these facets cause adjacent epitaxial source/drain regions 92 of a same FinFET to merge as illustrated by FIG. 17D. In other embodiments, adjacent epitaxial source/drain regions 92 remain separated after the epitaxy process is completed as illustrated by FIG. 17B. In the embodiments illustrated in FIGS. 17B and 17D, the first spacers 81 may be formed to a top surface of the STI regions 58 thereby blocking the epitaxial growth. In some other embodiments, the first spacers 81 may cover portions of the sidewalls of the fins 55 further blocking the epitaxial growth. In some other embodiments, the spacer etch used to form the first spacers 81 may be adjusted to remove the spacer material to allow the epitaxially grown region to extend to the surface of the STI region 58. As illustrated in FIGS. 17B and 17D, the backside vias 36 may be disposed between epitaxial source/drain regions 92 of adjacent FinFETs.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 18B:
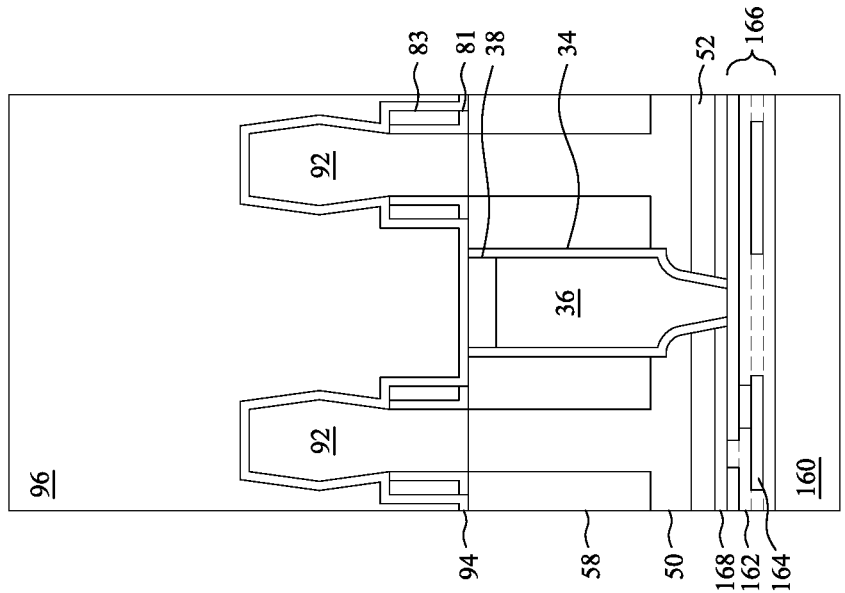
Figure 18A:
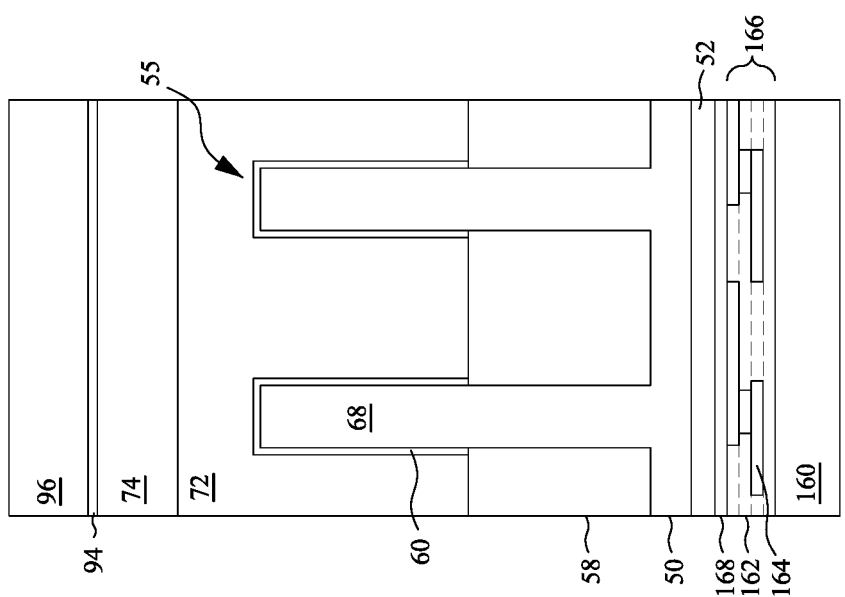
Figure 18C:
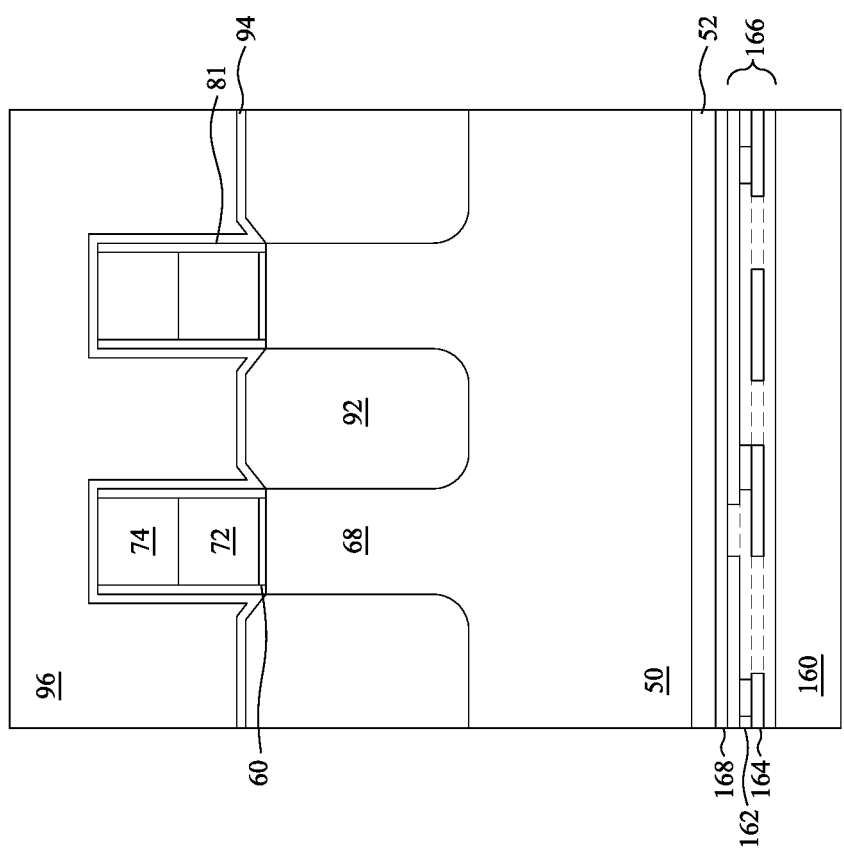

In FIGS. 18A through 18C, a first interlayer dielectric (ILD) 96 is deposited over the structure illustrated in FIGS. 17A through 17D. The first ILD 96 may be formed of a dielectric material, and may be deposited by any suitable method, such as CVD, PECVD, or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, the first spacers 81, the second spacers 83, the STI regions 58, the first liners 34, and the third dielectric layers 38. The CESL 94 may comprise a dielectric material, such as, silicon nitride, silicon oxide, silicon oxynitride, or the like, having a lower etch rate than the material of the overlying first ILD 96.

Figure 19B:
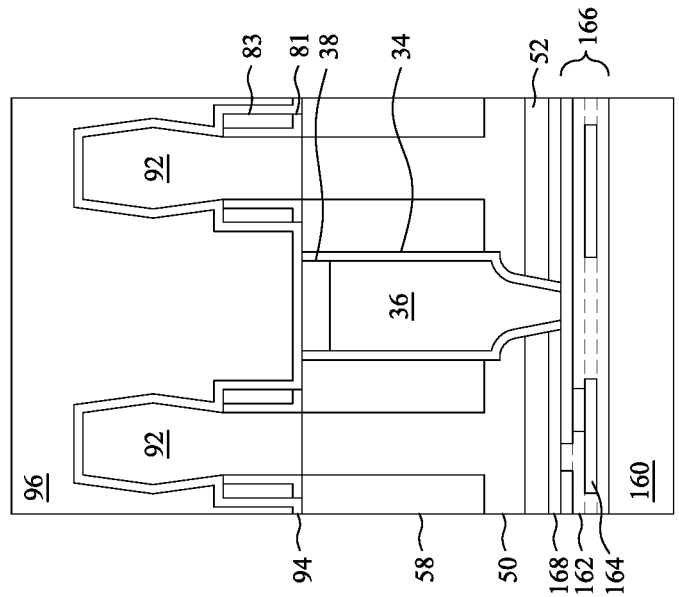
Figure 19A:
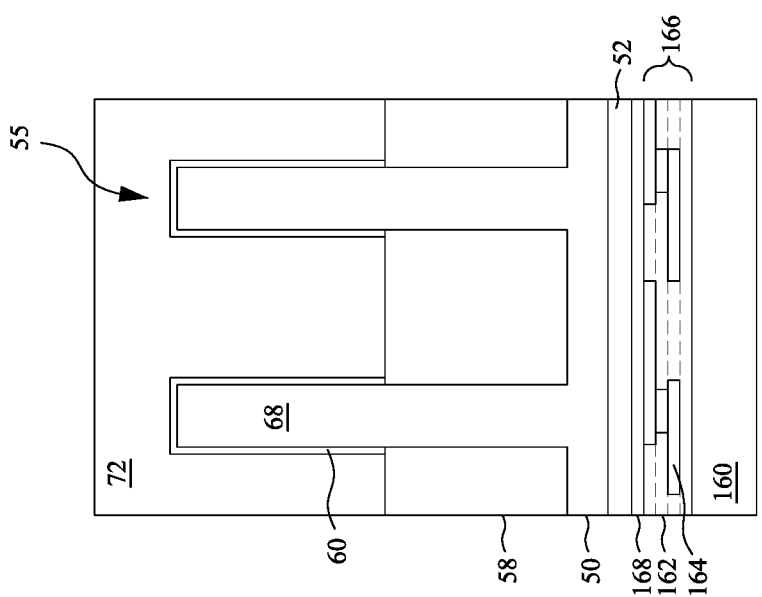
Figure 19C:
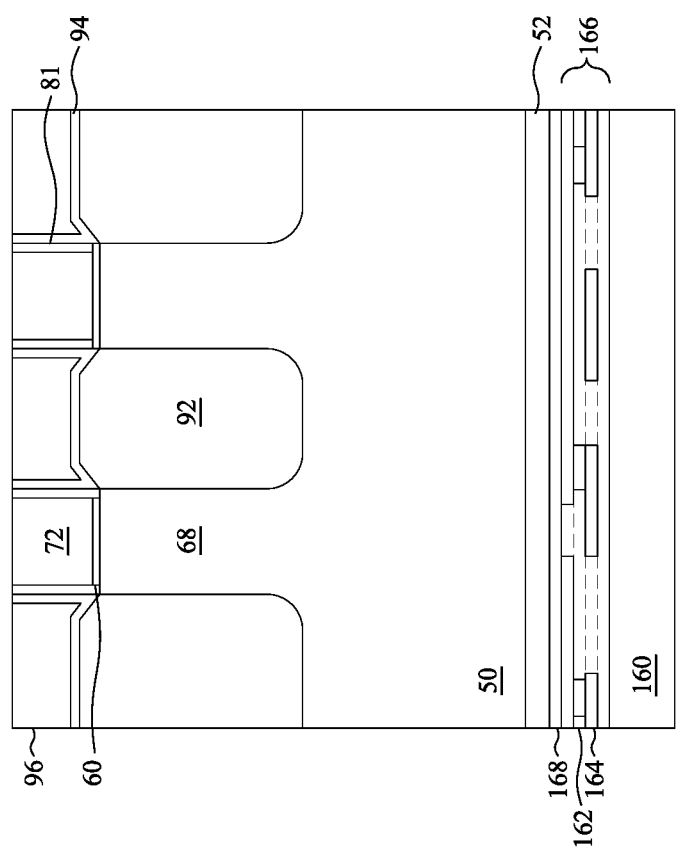

In FIGS. 19A through 19C, a planarization process, such as a CMP, may be performed to level the top surface of the first ILD 96 and the CESL 94 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, the first ILD 96, and the CESL 94 are level. Accordingly, the top surfaces of the dummy gates 72 are exposed through the first ILD 96 and the CESL 94. In some embodiments, the masks 74 may remain, in which case the planarization process levels the top surfaces of the first ILD 96 and the CESL 94 with the top surfaces the masks 74 and the first spacers 81.

Figure 20B:
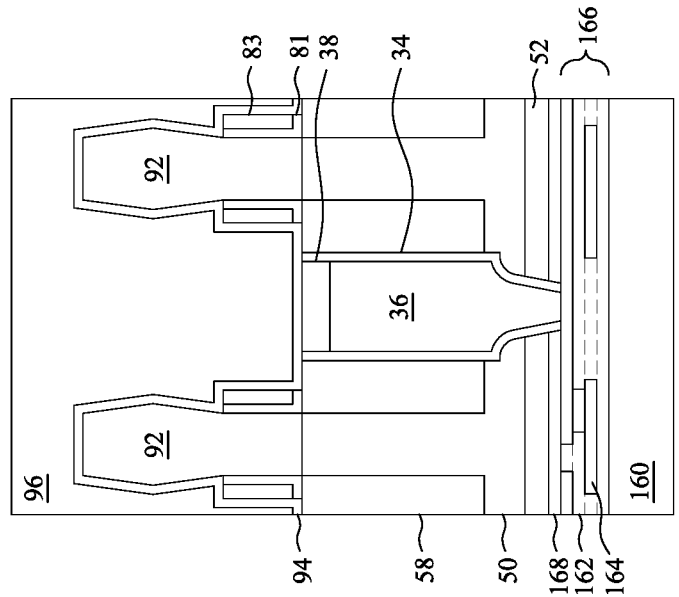
Figure 20A:
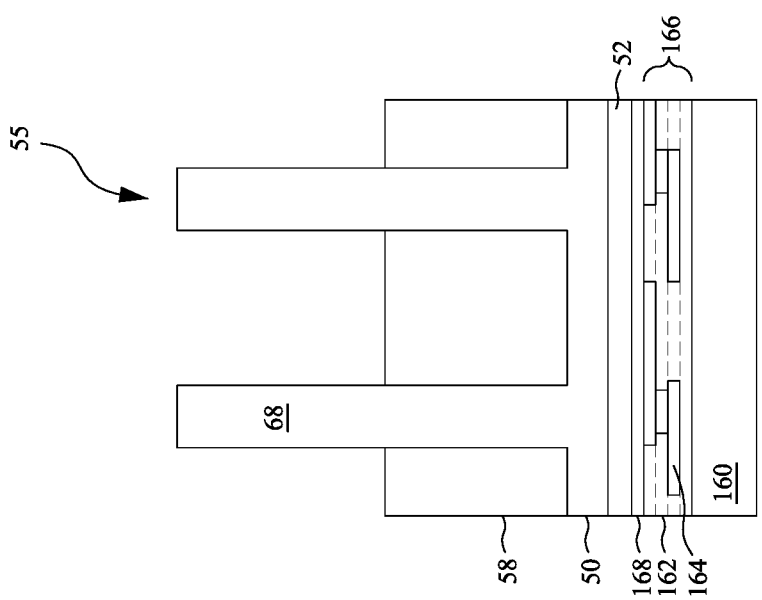
Figure 20C:
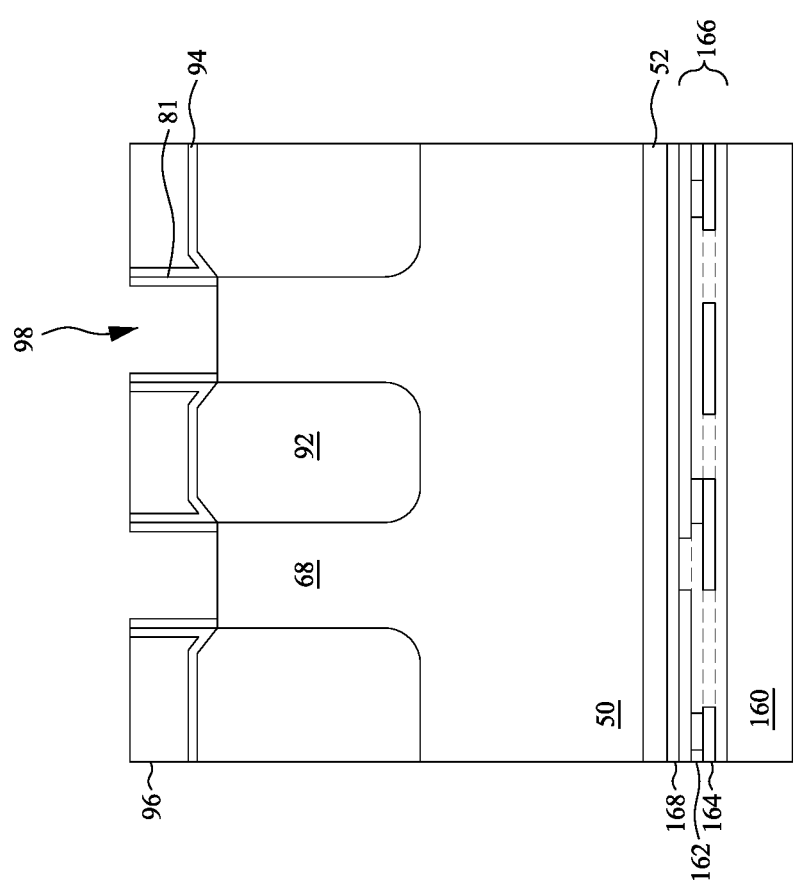

In FIGS. 20A through 20C, the dummy gates 72, and the masks 74 if present, are removed in one or more etching steps, so that second recesses 98 are formed. Portions of the dummy dielectric layer 60 in the second recesses 98 may also be removed. In some embodiments, only the dummy gates 72 are removed and the dummy dielectric layer 60 remains and is exposed by the second recesses 98. In some embodiments, the dummy dielectric layer 60 is removed from the second recesses 98 in a first region of a die (e.g., a core logic region) and remains in the second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96, the CESL 94, the first source/drain contacts 112, the first spacers 81, or the STI regions 58. Each of the second recess 98 exposes and/or overlies the channel regions 68 of respective fins 55. Each of the channel regions 68 is disposed between neighboring pairs of the epitaxial source/drain regions 92. During the removal, the dummy dielectric layer 60 may be used as an etch stop layer when the dummy gates 72 are etched. The dummy dielectric layer 60 may then be optionally removed after the removal of the dummy gates 72.

Figure 21B:
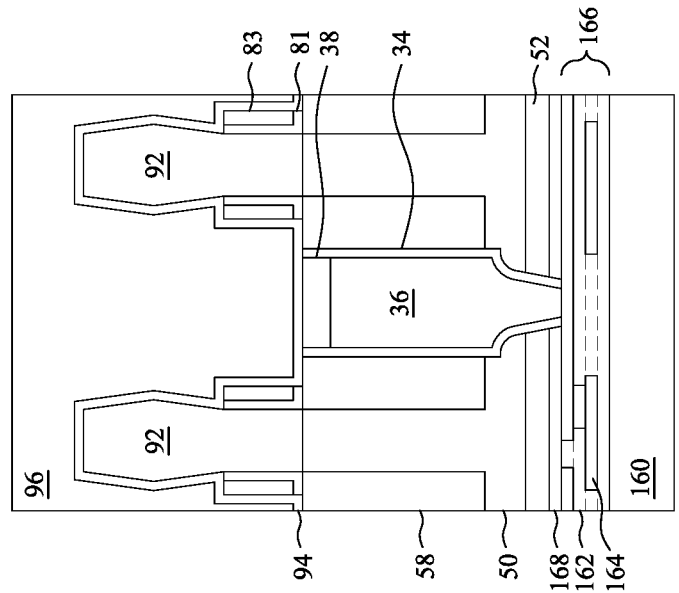
Figure 21A:
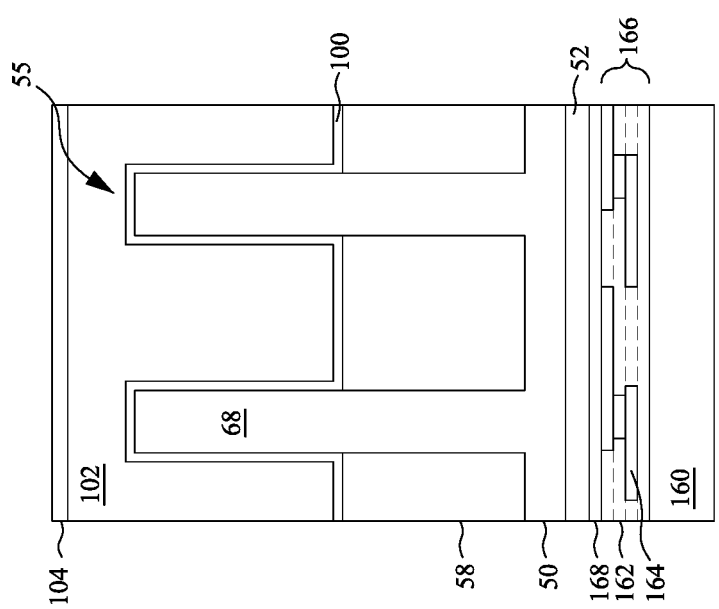
Figure 21C:
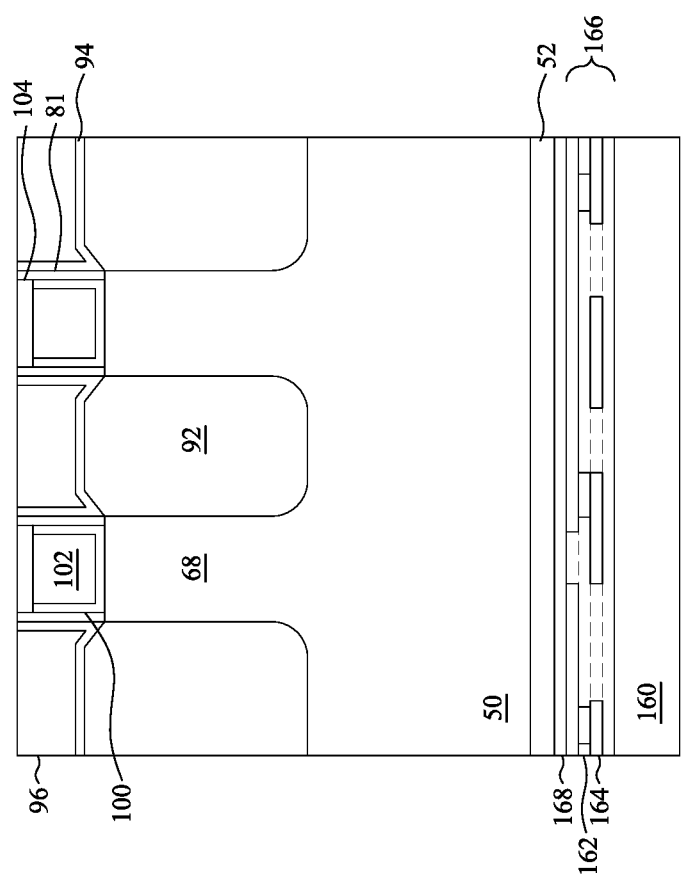

In FIGS. 21A through 21C, gate dielectric layers 100 and gate electrodes 102 are formed for replacement gates. The gate dielectric layers 100 are deposited conformally in the second recesses 98. The gate dielectric layers 100 may be formed on top surfaces and sidewalls of the fins 55. The gate dielectric layers 100 may also be deposited on top surfaces of the first ILD 96, the CESL 94, the first spacers 81, and the STI regions 58 and on sidewalls of the first spacers 81.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k-value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region and the p-type region. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 21A and 21C, the gate electrodes 102 may comprise any number of liner layers, any number of work function tuning layers, and a fill material. Any combination of the layers which make up the gate electrodes 102 may be deposited between adjacent ones of the fins 55.

The formation of the gate dielectric layers 100 in the n-type region and the p-type region may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surfaces of the first ILD 96, the CESL 94, and the first spacers 81. The remaining portions of material of the gate electrodes 102 and the gate dielectric layers 100 thus form replacement gate structures of the resulting Fin-FETs. The gate electrodes 102 and the gate dielectric layers 100 may be collectively referred to as "gate structures."

Further in FIGS. 21A through 21C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 26A through 26C) penetrate through the gate masks 104 to contact the top surfaces of the recessed gate electrodes 102.

In FIGS. 22A through 22D, the first ILD 96, the CESL 94, and the third dielectric layers 38 are etched to form third recesses 108 exposing surfaces of the epitaxial source/drain regions 92 and the backside vias 36. The third recesses 108 may be formed by etching using anisotropic etching processes, such as RIE, NBE, or the like. In some embodiments, the third recesses 108 may be etched through the first ILD 96 and the CESL 94 to expose the epitaxial source/drain regions 92 using a first etching process and the third recesses 108 may be etched through the first ILD 96, the CESL 94, and the third dielectric layers 38 using a second etching process. The first etching process and the second etching process may use separate masks, such as photoresists, to mask portions of the first ILD 96 from the first and second etching processes. In some embodiments, the etching processes may over-etch, and therefore, the third recesses 108 extend into the epitaxial source/drain regions 92 and/or the backside vias 36.

Figure 22B:
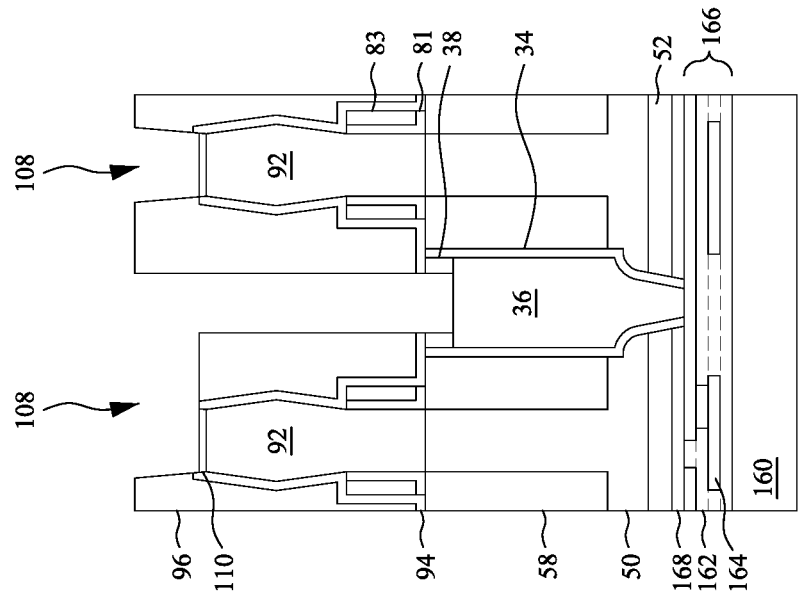
Figure 22A:
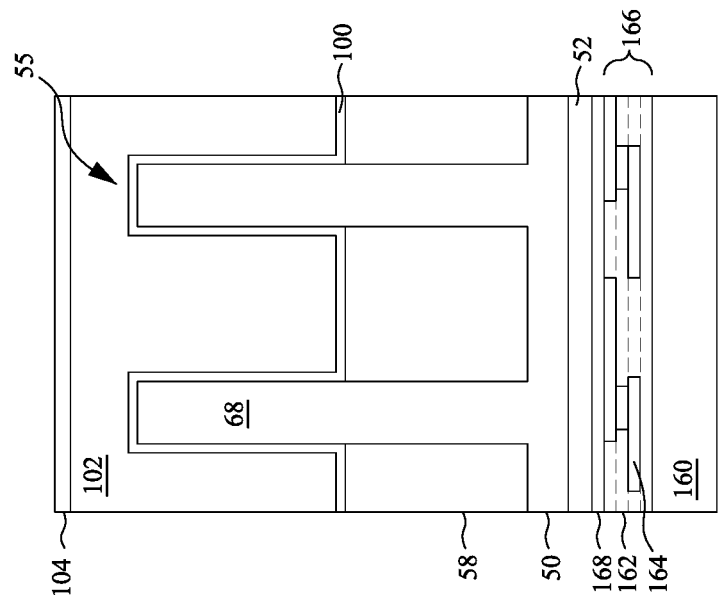
Figure 22D:
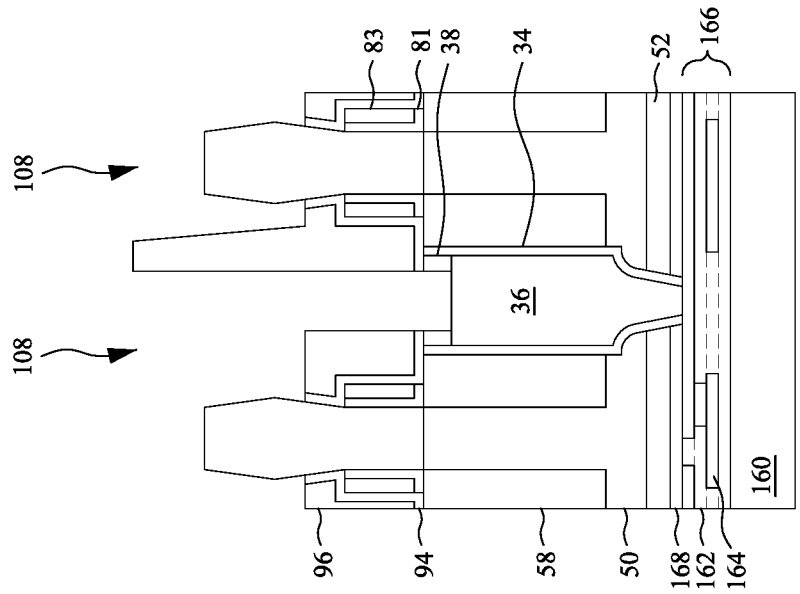
Figure 22C:
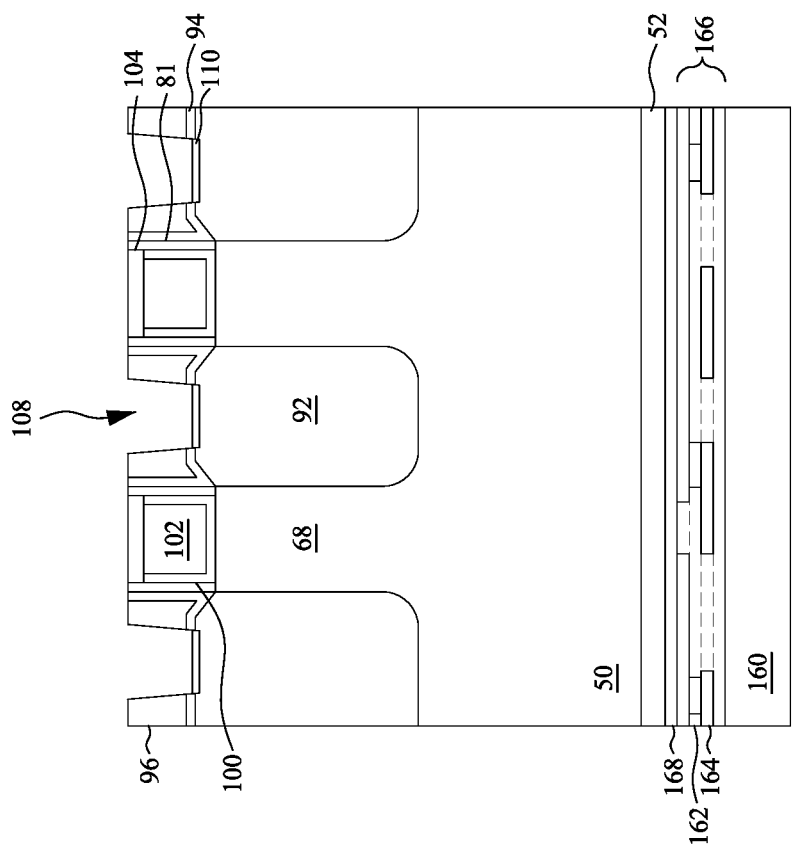

As illustrated in FIG. 22B, the third recesses 108 may only expose topmost surfaces of the epitaxial source/drain regions 92. However, in some embodiments, such as the embodiment illustrated in FIG. 22D, the third recesses 108 may also expose side surfaces of the epitaxial source/drain regions 92. Exposing the side surfaces as well as the top surfaces of the epitaxial source/drain regions 92 may increase the contact area between the epitaxial source/drain regions and subsequently formed source/drain contacts (such as the first source/drain contacts 112, discussed below with respect to FIGS. 23A through 23D). This reduces contact resistance and improves device performance.

After the third recesses 108 are formed, silicide regions 110 may be formed over the epitaxial source/drain regions 92. In some embodiments, the silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although the silicide regions 110 are referred to as silicide regions, the silicide regions 110 may also be germanide regions, or silicon germanide regions (e.g., regions comprising silicide and germanide). In an embodiment, the silicide regions 110 comprise TiSi and have thicknesses ranging from about 2 nm to about 10 nm.

Figure 23B:
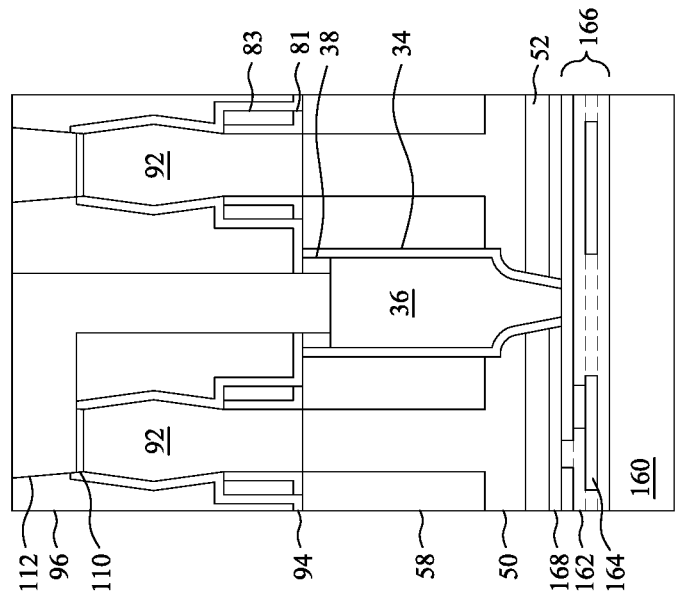
Figure 23A:
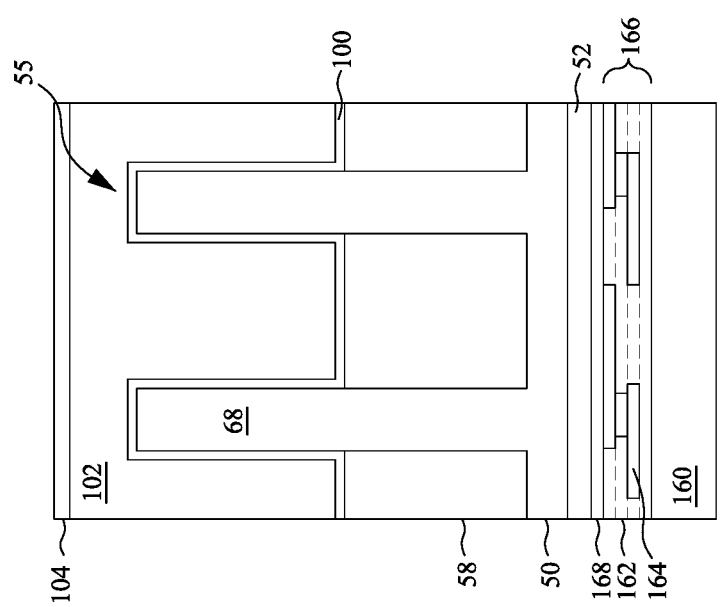
Figure 23D:
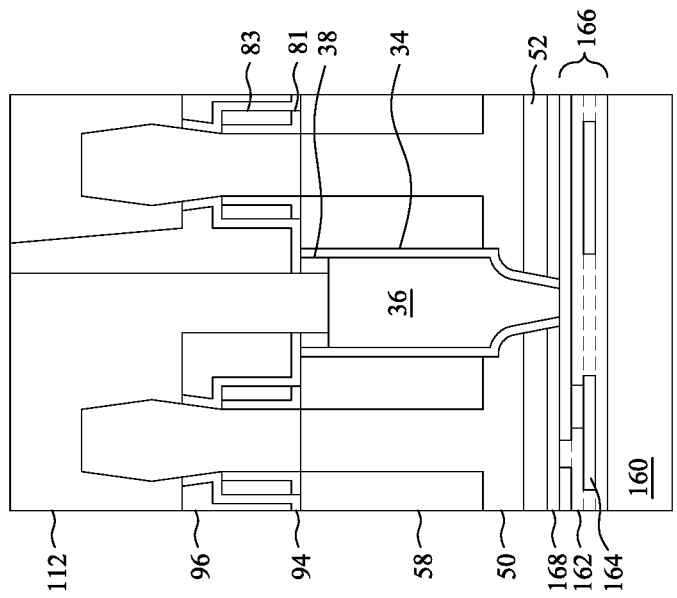
Figure 23C:
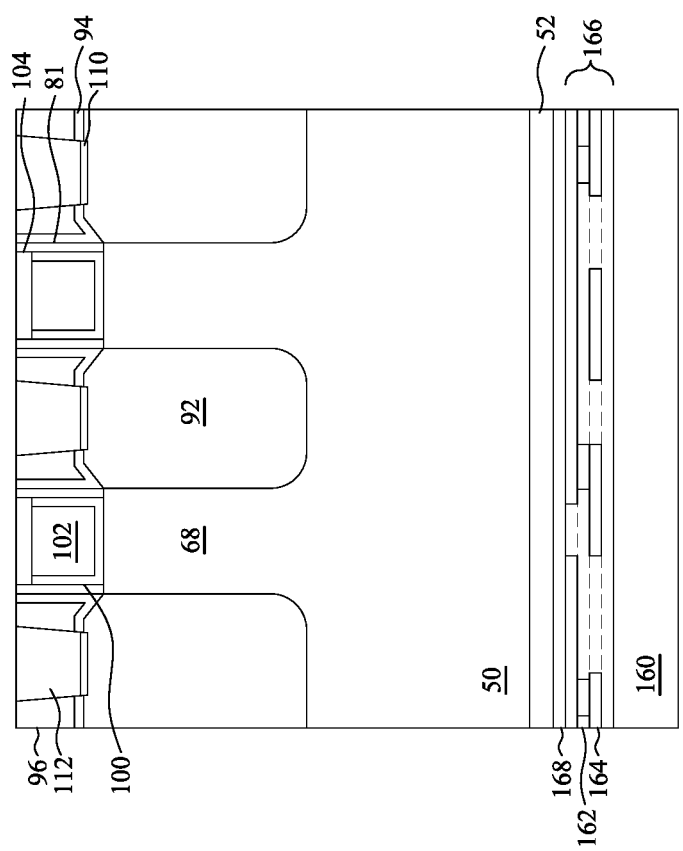

In FIGS. 23A through 23D, first source/drain contacts 112 (also referred to as contact plugs) are formed in the third recesses 108. The first source/drain contacts 112 may comprise one or more layers, such as barrier layers, diffusion layers, and fill materials. For example, in some embodiments, the first source/drain contacts 112 each include a barrier layer and a conductive material, and are each electrically coupled to an underlying conductive feature (e.g., an epitaxial source/drain region 92). The first source/drain contacts 112 may be electrically coupled to the epitaxial source/drain regions 92 through the silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the first ILD 96. The first source/drain contacts 112 may extend to silicide regions 110 on the top surfaces of the epitaxial source/drain regions 92, as illustrated in FIG. 23B, or may surround the top surfaces and side surfaces of the epitaxial source/drain regions 92, as illustrated in FIG. 23D. Increasing the contact area between the first source/drain contacts 112 and the epitaxial source/drain regions 92 decreases contact resistance between the first source/drain contacts 112 and the epitaxial source/drain regions 92, which improves device performance. As illustrated in FIG. 23B, the first source/drain contacts 112 may connect certain ones of the epitaxial source/drain regions 92 to the backside vias 36, while other epitaxial source/drain regions 92 are not connected to the backside vias 36 by the first source/drain contacts 112.

Figure 24B:
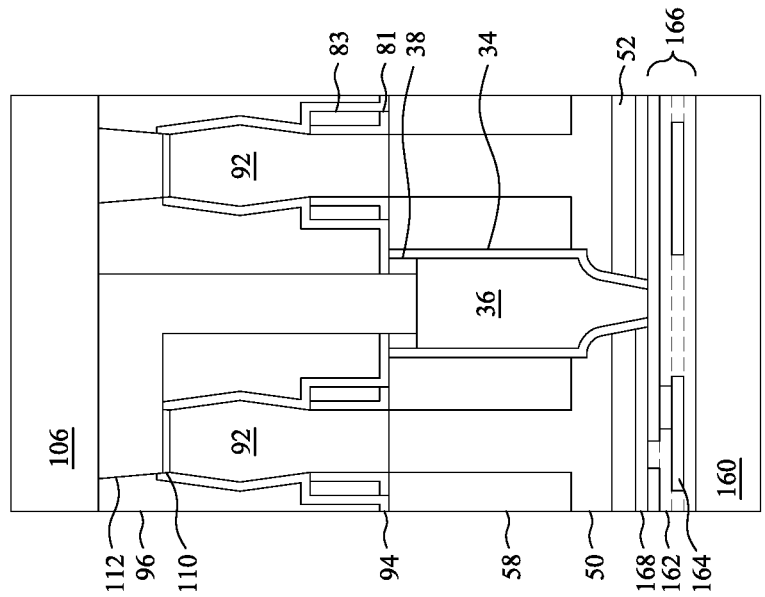
Figure 24A:
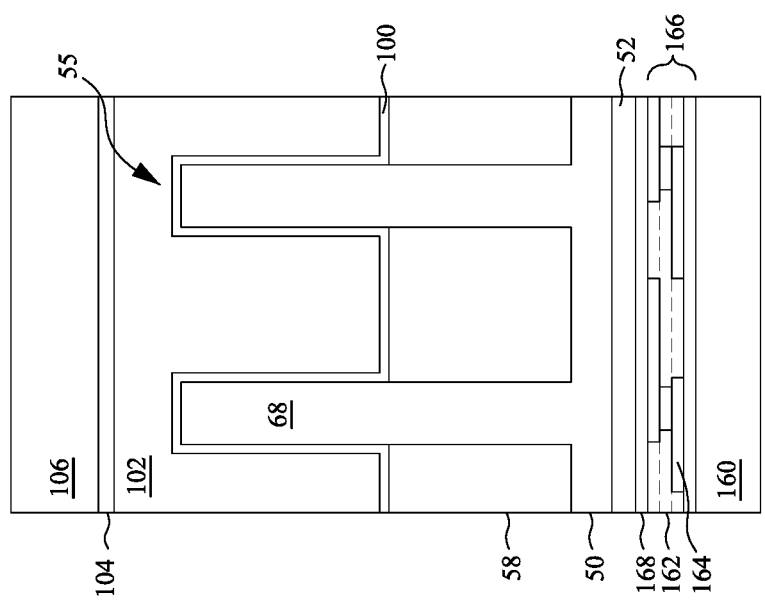
Figure 24C:
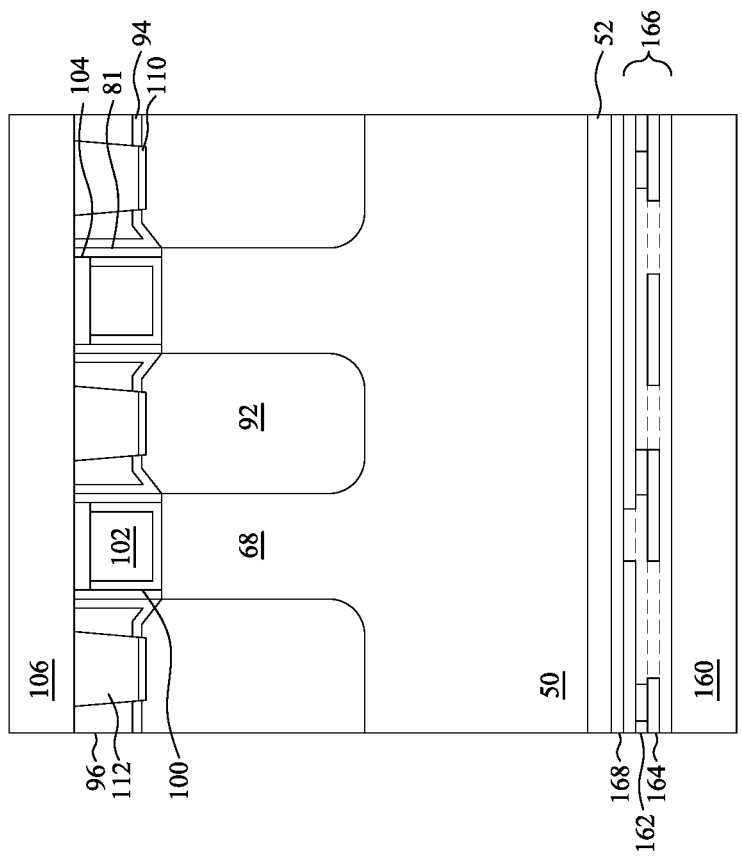

In FIGS. 24A through 24C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 25B:
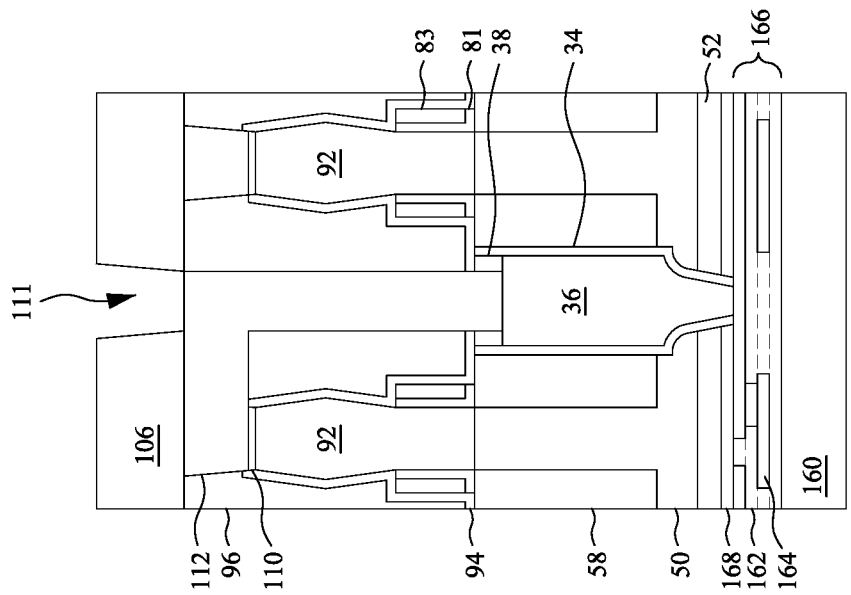
Figure 25A:
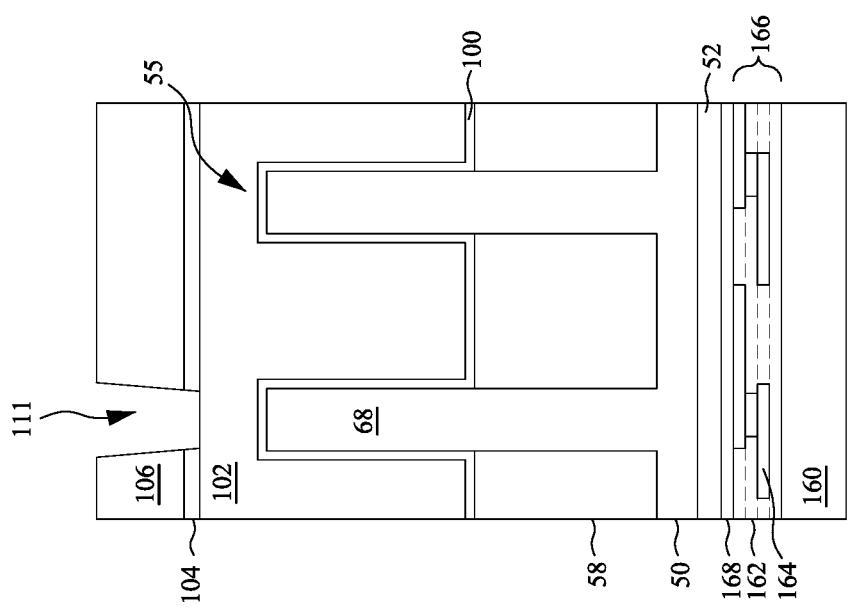
Figure 25C:
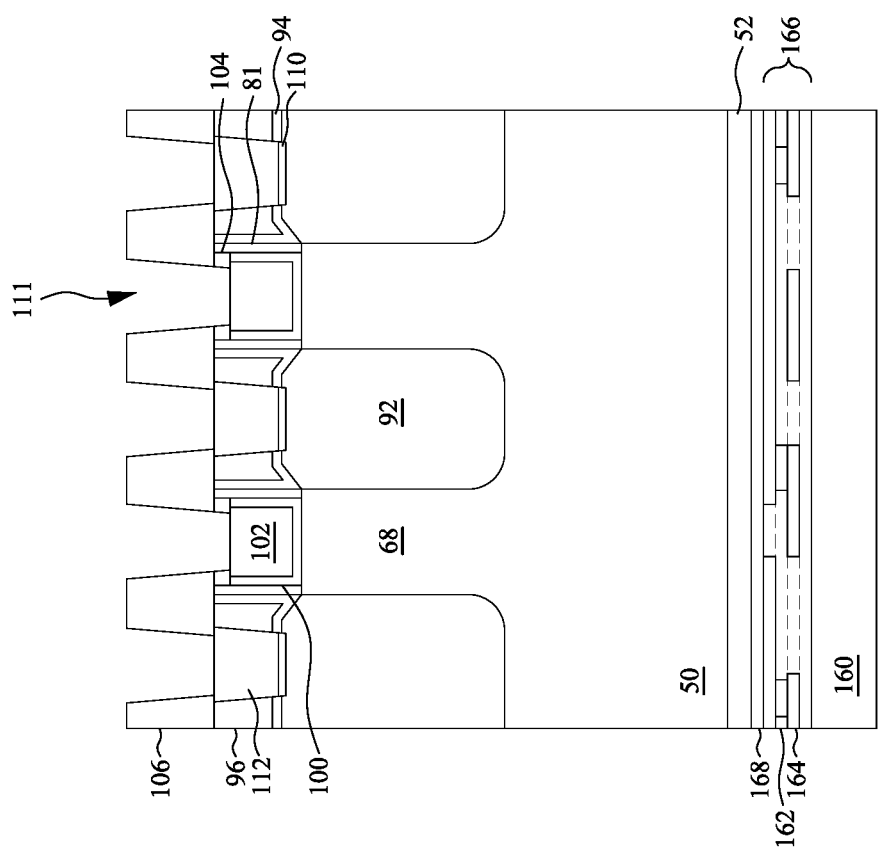

In FIGS. 25A through 25C, the second ILD 106 and the gate masks 104 are etched to form fourth recesses 111 exposing surfaces of the first source/drain contacts 112 and/or the gate structures. The fourth recesses 111 may be formed by etching using an anisotropic etching process, such as RIE, NBE, or the like. In some embodiments, the fourth recesses 111 may be etched through the second ILD 106 using a first etching process and may be etched through the gate masks 104 using a second etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 111 extend into the first source/drain contacts 112 and/or the gate structures. Although FIG. 25C illustrates the fourth recesses 111 as exposing the first source/drain contacts 112 and the gate structures in a same cross-section, in various embodiments, the first source/drain contacts 112 and the gate structures may be exposed in different cross-sections, thereby reducing the risk of shorting subsequently formed contacts.

Figure 26B:
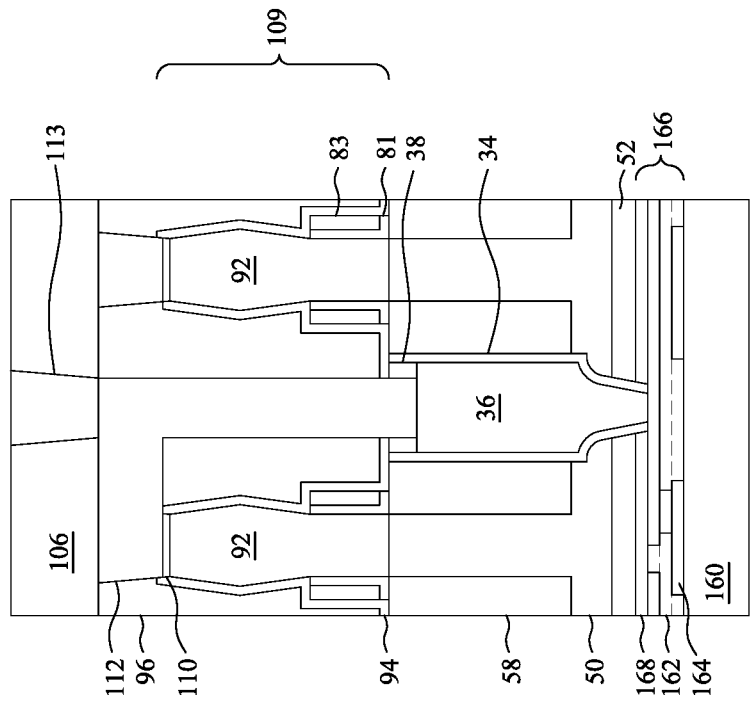
Figure 26A:
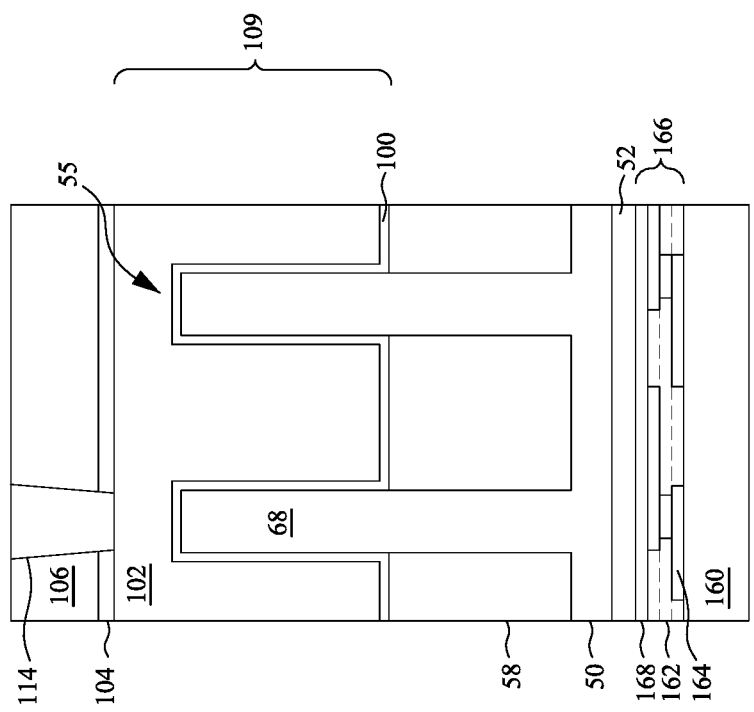
Figure 26C:
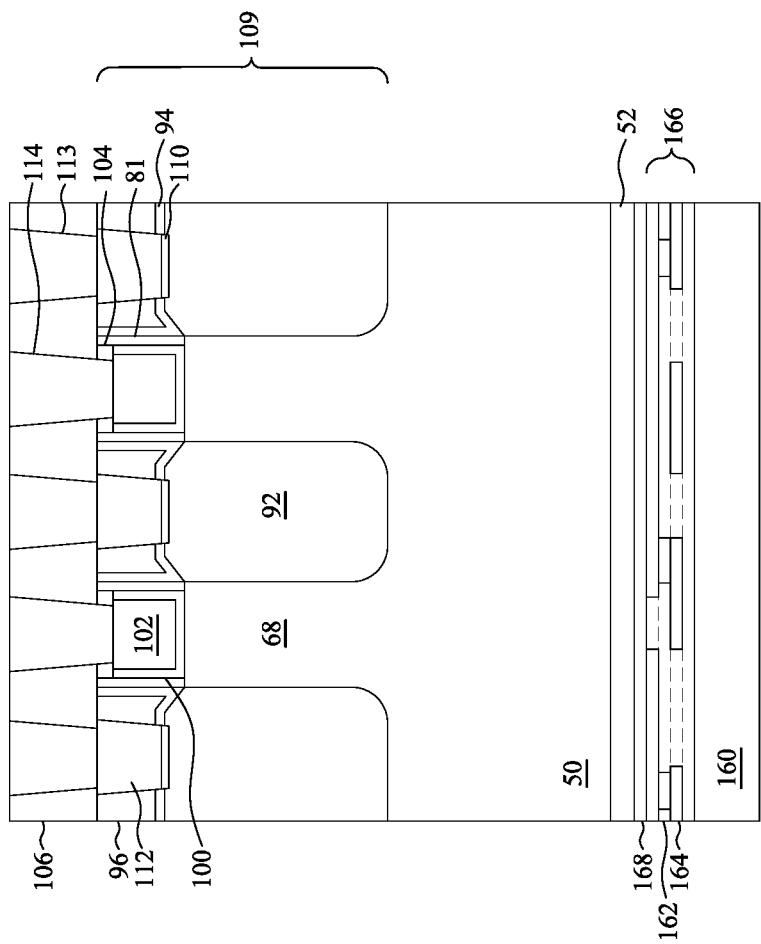

In FIGS. 26A through 26C, second source/drain contacts 113 and gate contacts 114 (also referred to as contact plugs) are formed in the fourth recesses 111. The second source/drain contacts 113 and the gate contacts 114 may each comprise one or more layers, such as barrier layers, diffusion layers, and fill materials. For example, in some embodiments, the second source/drain contacts 113 and the gate contacts 114 each include a barrier layer and a conductive material, and are each electrically coupled to an underlying conductive feature (e.g., a gate electrode 102 and/or a first source/drain contact 112). The gate contacts 114 are electrically coupled to the gate electrodes 102 and the second source/drain contacts 113 are electrically coupled to the epitaxial source/drain regions 92 through the first source/drain contacts 112 and the silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the channel regions 68 of the fins 55, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 27A through 27C) being formed over a front-side thereof and the first backside interconnect structure 116 being formed over a backside thereof. Although the device layer is described as having FinFETs, other embodiments may include a device layer having different types of transistors (e.g., planar FETs, nano-FETs, thin film transistors (TFTs), or the like).

Although FIGS. 26A through 26C illustrate a second source/drain contact 113 extending to each of the first source/drain contacts 112 and electrically coupled to each of the epitaxial source/drain regions 92, the second source/drain contacts 113 may be omitted from certain ones of the first source/drain contacts 112. For example, as discussed above, the backside vias 36 may be electrically coupled to one or more of the epitaxial source/drain regions 92 through the first source/drain contacts 112. For these particular epitaxial source/drain regions 92, the second source/drain contacts 113 may be omitted or may be dummy contacts that are not electrically connected to any overlying conductive lines (such as the second conductive features 122, discussed below with respect to FIGS. 27A through 27C).

FIGS. 27A through 31C illustrate intermediate steps of forming front-side interconnect structures and additional backside interconnect structures on the transistor structures 109. The front-side interconnect structures and the additional backside interconnect structures may each comprise conductive features that are electrically connected to the FinFETs formed on the substrate 50. FIGS. 27A, 28A, 29A, 30A, and 31A illustrate reference cross-section A-A' illustrated in FIG. 1. FIGS. 27B, 28B, 29B, 30B, and 31B illustrate reference cross-section B-B' illustrated in FIG. 1. FIGS. 27C, 28C, 29C, 30C, 30D, and 31C illustrate reference cross-section C-C' illustrated in FIG. 1. The process steps described in FIGS. 27A through 31C may be applied to both the n-type region and the p-type region.

Figure 27B:
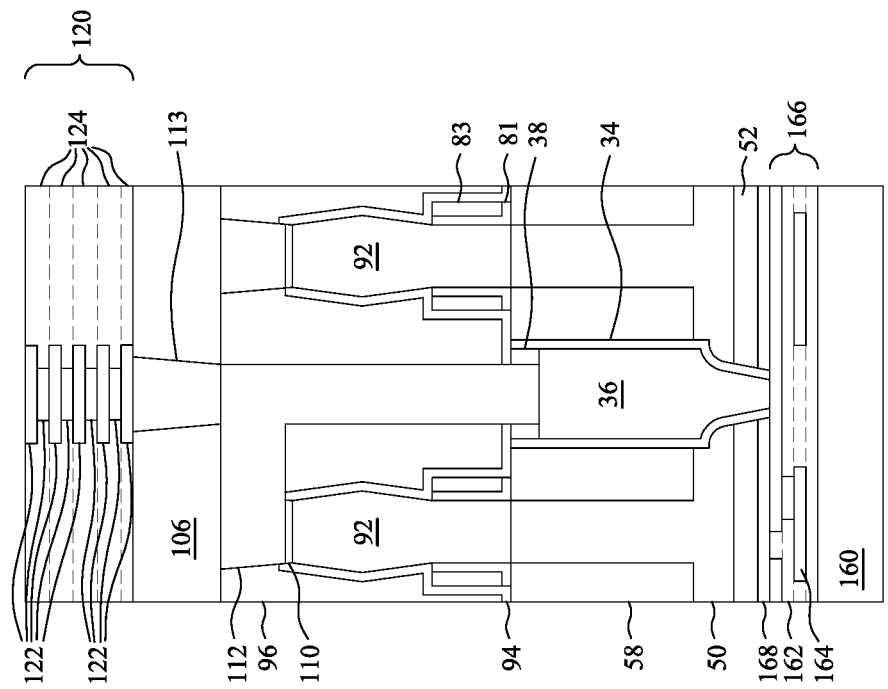
Figure 27A:
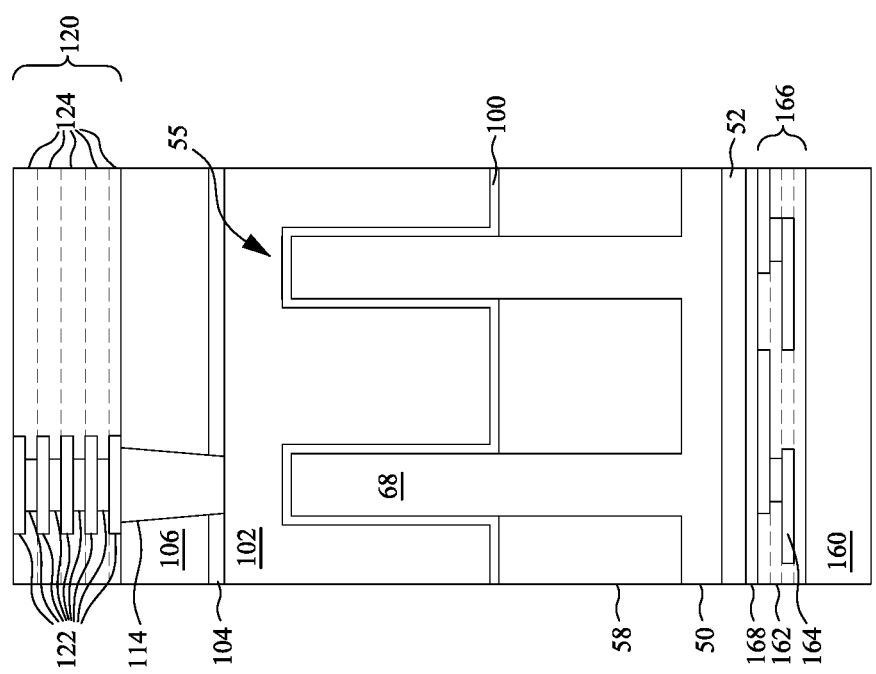
Figure 27C:
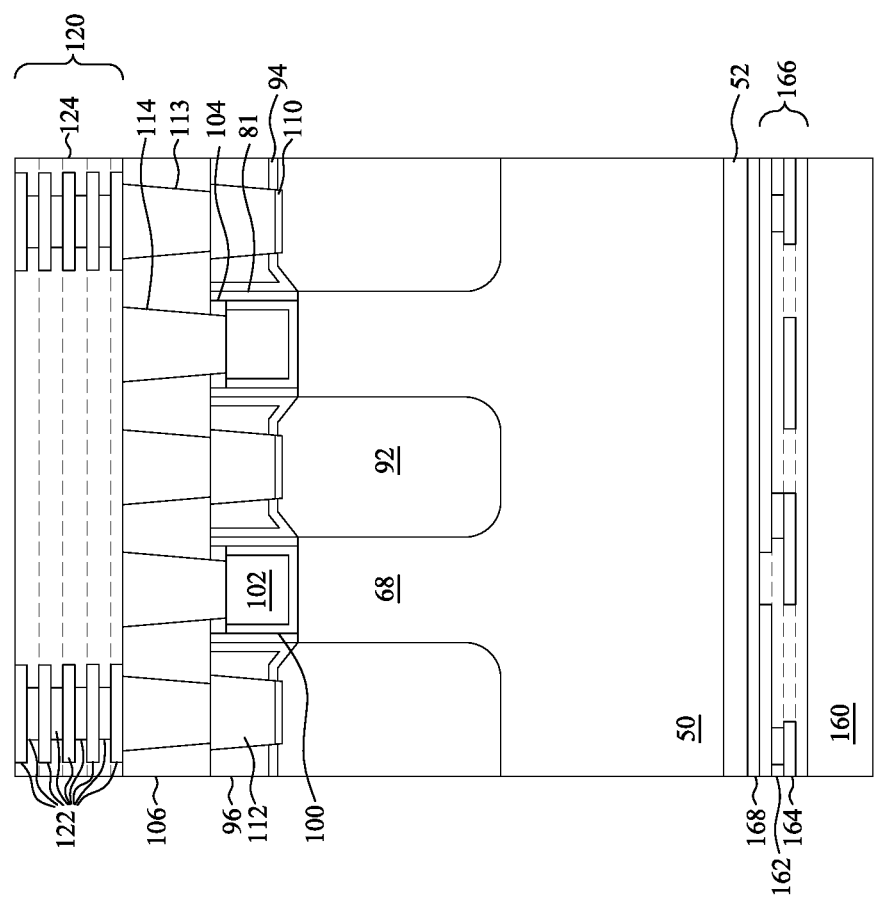

In FIGS. 27A through 27C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of second conductive features 122 formed in one or more stacked fourth dielectric layers 124. Each of the stacked fourth dielectric layers 124 may comprise a dielectric material, such as a low-k dielectric material, an extra low-k (ELK) dielectric material, or the like. The fourth dielectric layers 124 may be deposited using an appropriate process, such as, CVD, ALD, PVD, PECVD, or the like.

The second conductive features 122 may comprise conductive lines and conductive vias interconnecting the layers of conductive lines. The conductive vias may extend through respective ones of the fourth dielectric layers 124 to provide vertical connections between layers of the conductive lines. The second conductive features 122 may be formed through any acceptable process, such as, a damascene process, a dual damascene process, or the like.

In some embodiments, the second conductive features 122 may be formed using a damascene process in which a respective fourth dielectric layer 124 is patterned utilizing a combination of photolithography and etching techniques to form trenches corresponding to the desired pattern of the second conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, tantalum oxide, combinations thereof, or the like, and suitable materials for the conductive material include copper, silver, gold, tungsten, aluminum, combinations thereof, or the like. In an embodiment, the second conductive features 122 may be formed by depositing a seed layer of copper or a copper alloy, and filling the trenches by electroplating. A chemical mechanical planarization (CMP) process or the like may be used to remove excess conductive material from a surface of the respective fourth dielectric layer 124 and to planarize surfaces of the fourth dielectric layer 124 and the second conductive features 122 for subsequent processing.

FIGS. 27A through 27C illustrate five layers of the second conductive features 122 and the fourth dielectric layers 124 in the front-side interconnect structure 120. However, it should be appreciated that the front-side interconnect structure 120 may comprise any number of second conductive features 122 disposed in any number of fourth dielectric layers 124. The front-side interconnect structure 120 may be electrically connected to the gate contacts 114 and the second source/drain contacts 113 to form functional circuits. In some embodiments, the functional circuits formed by the front-side interconnect structure 120 may comprise logic circuits, memory circuits, image sensor circuits, or the like.

Figure 28B:
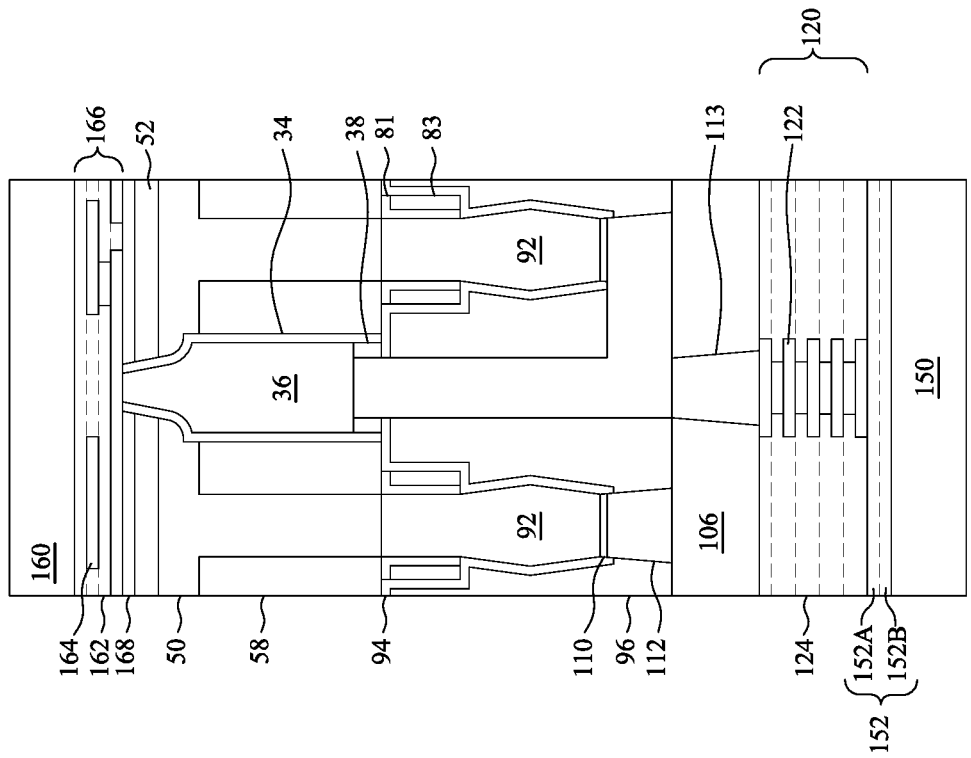
Figure 28A:
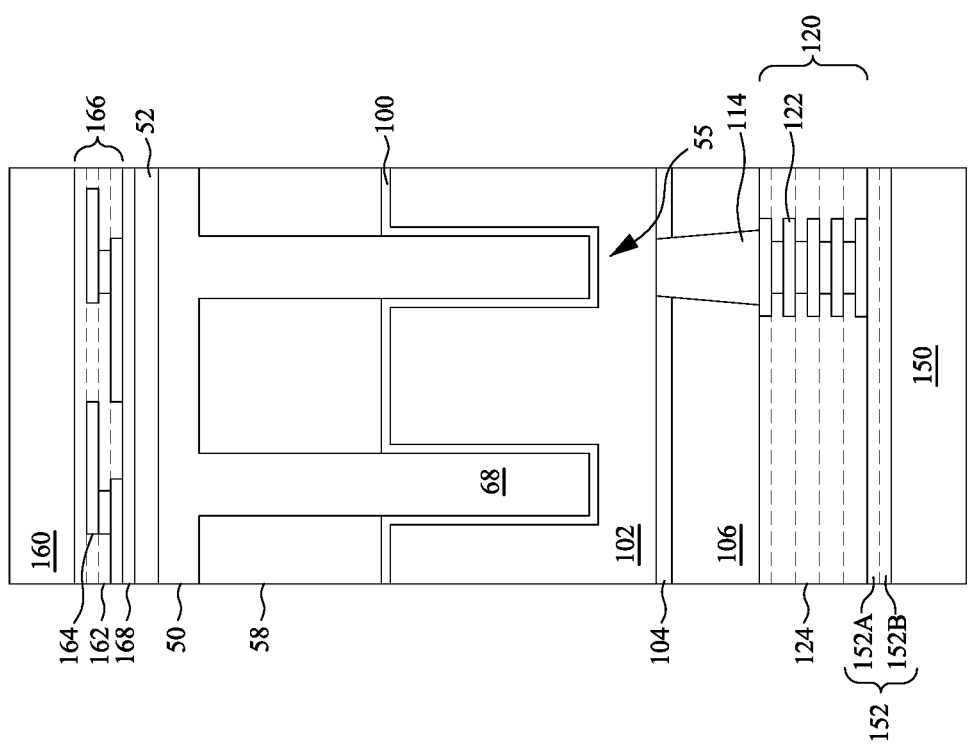
Figure 28C:
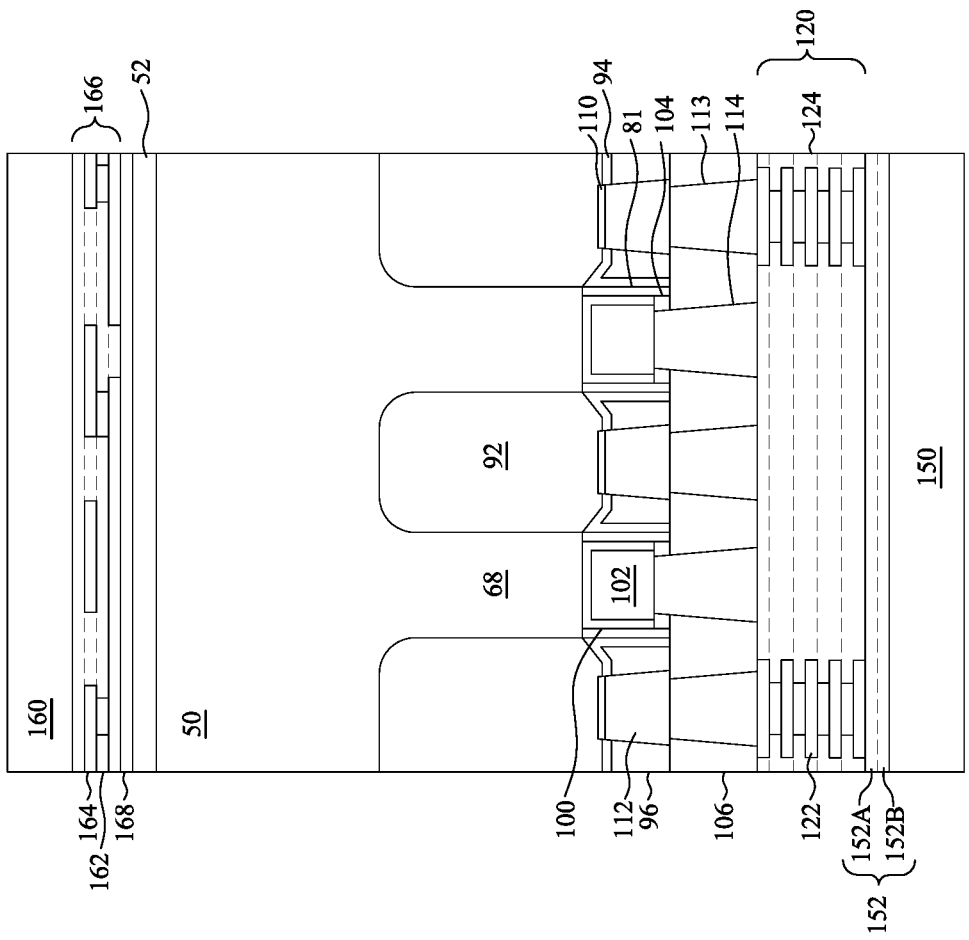

In FIGS. 28A through 28C, a second carrier substrate 150 is bonded to a top surface of the front-side interconnect structure 120 by a second bonding layer 152A and a third bonding layer 152B (collectively referred to as a bonding layer 152). The second carrier substrate 150 may be a glass carrier substrate, a ceramic carrier substrate, a wafer (e.g., a silicon wafer), or the like. The second carrier substrate 150 may provide structural support during subsequent processing steps and in the completed device.

In various embodiments, the second carrier substrate 150 may be bonded to the front-side interconnect structure 120 using a suitable technique, such as dielectric-to-dielectric bonding, or the like. The dielectric-to-dielectric bonding may comprise depositing the second bonding layer 152A on the front-side interconnect structure 120. In some embodiments, the second bonding layer 152A comprises silicon oxide (e.g., a high-density plasma (HDP) oxide or the like) that is deposited by CVD, ALD, PVD, or the like. The third bonding layer 152B may likewise be an oxide layer that is formed on a surface of the second carrier substrate 150 prior to bonding using, for example, CVD, ALD, PVD, thermal oxidation, or the like. Other suitable materials may be used for the second bonding layer 152A and the third bonding layer 152B.

The dielectric-to-dielectric bonding process may further include applying a surface treatment to one or more of the second bonding layer 152A and the third bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The second carrier substrate 150 is then aligned with the front-side interconnect structure 120 and the two are pressed against each other to initiate a pre-bonding of the second carrier substrate 150 to the front-side interconnect structure 120. The pre-bonding may be performed at room temperature (e.g., from about 21° C. to about 25° C.). After the pre-bonding, an annealing process may be applied by, for example, heating the front-side interconnect structure 120 and the second carrier substrate 150 to a temperature of about 170° C.

Further in FIGS. 28A through 28C, after the second carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed.

Figure 29C:
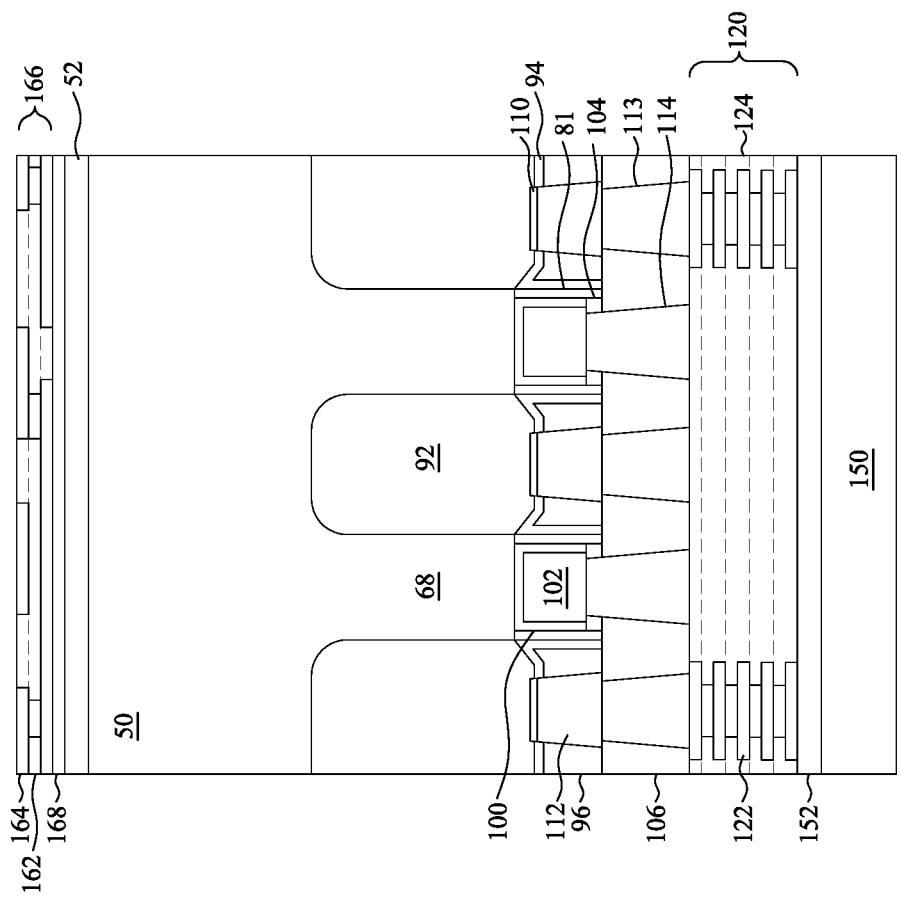

In FIGS. 29A through 29C, a thinning process may be applied to the first carrier substrate 160 and the first dielectric layers 162 to expose the first conductive features 164 of the first backside interconnect structure 166. The thinning process may comprise a planarization process (e.g., a mechanical grinding, a CMP, or the like), an etch-back process, a combination thereof, or the like. In some embodiments, the thinning process may be a suitable etching process, such as an isotropic etching process (e.g., a wet etching process), an anisotropic etching process (e.g., a dry etching process), or the like. As illustrated in FIGS. 29A through 29C, following the thinning of the first carrier substrate 160 and the first dielectric layers 162, backside surfaces of the first conductive features 164 and the first dielectric layers 162 may be exposed.

In FIGS. 30A through 30D, a second backside interconnect structure 136 is formed over the first backside interconnect structure 166. The second backside interconnect structure 136 may be referred to as a backside interconnect structure because it is formed on a backside of the transistor structures 109 (e.g., a side of the transistor structures 109 opposite the side of the transistor structure 109 on which active devices are formed). The second backside interconnect structure 136 may comprise materials and be formed using processes the same as or similar to those used for the front-side interconnect structure 120, discussed above with respect to FIGS. 27A through 27C. In particular, the second backside interconnect structure 136 may comprise stacked layers of third conductive features 140 formed in fifth dielectric layers 138. The third conductive features 140 may include routing lines (e.g., for routing to and from subsequently formed contact pads and external connectors). The third conductive features 140 may further be patterned to include one or more embedded passive devices such as, resistors, capacitors, inductors, or the like. The embedded passive devices may be integrated with the first conductive features 164 and the backside vias 36 (e.g., the power rail) to provide circuits (e.g., power circuits) on the backside of the FinFETs.

The second backside interconnect structure 136 may be formed by back-end-of-line (BEOL) processes and may be formed with greater pitches and critical dimensions as compared to the first backside interconnect structure 166. For example, the conductive lines of the third conductive features 140 may have pitches greater than about 30 nm or from about 30 nm to about 1 μm, widths greater than about 15 nm, and thicknesses greater than about 15 nm. The conductive vias of the third conductive features 140 may have critical dimensions greater than about 15 nm and heights greater than about 15 nm. By forming the first backside interconnect structure 166 using the FEOL processes described above, the first backside interconnect structure 166 can be formed with smaller pitches and critical dimensions than the second backside interconnect structure 136, which reduces device size and increases device density. Moreover, the first backside interconnect structure 166 can be formed with reduced device defects.

Figure 30B:
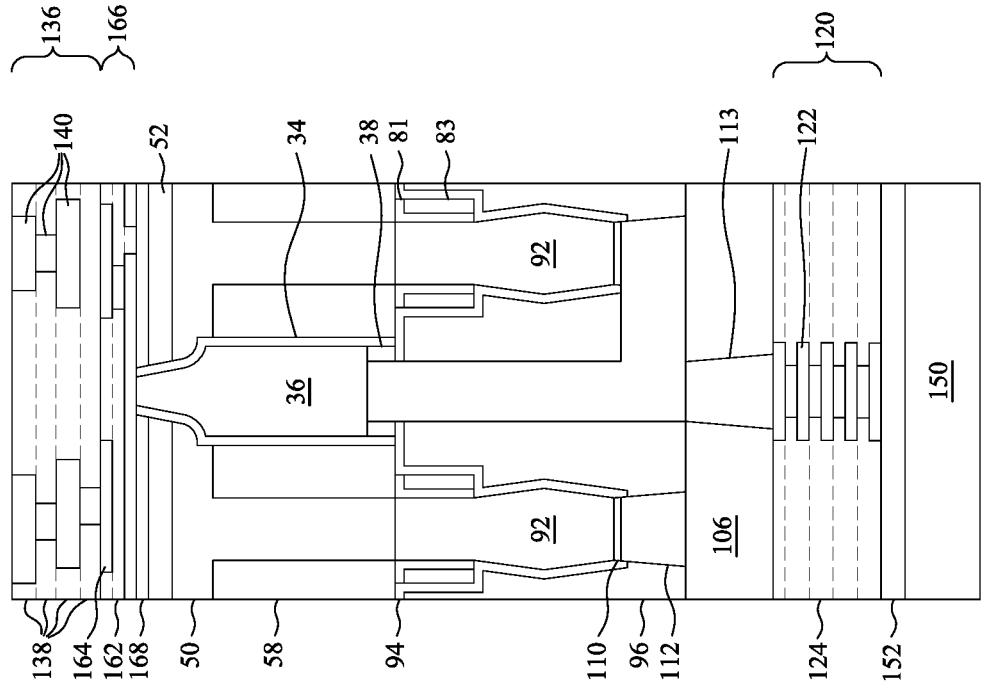
Figure 30A:
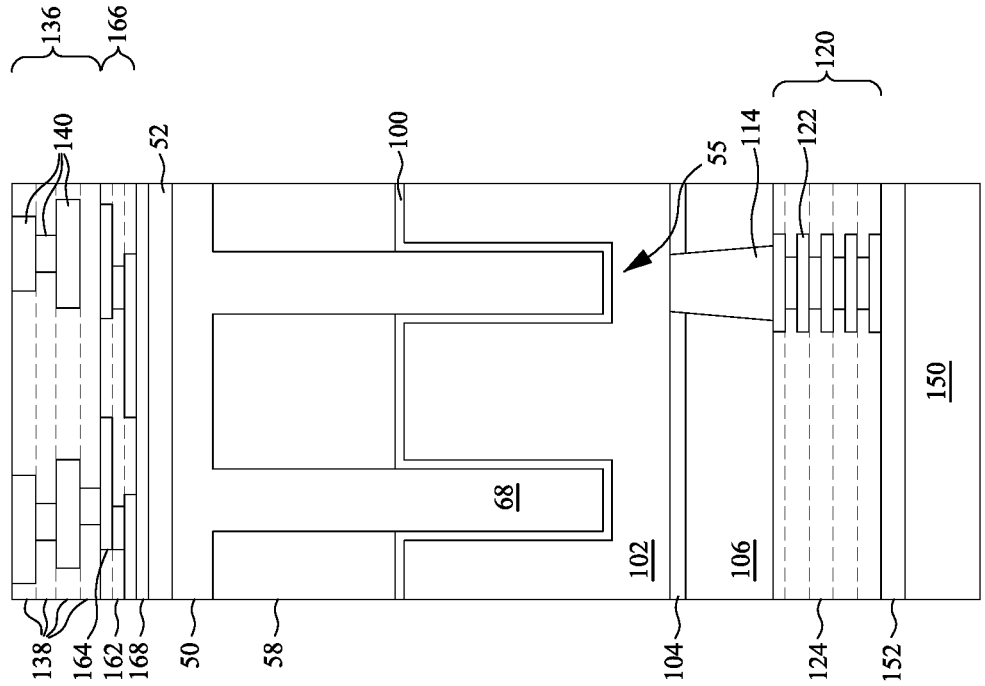
Figure 30C:
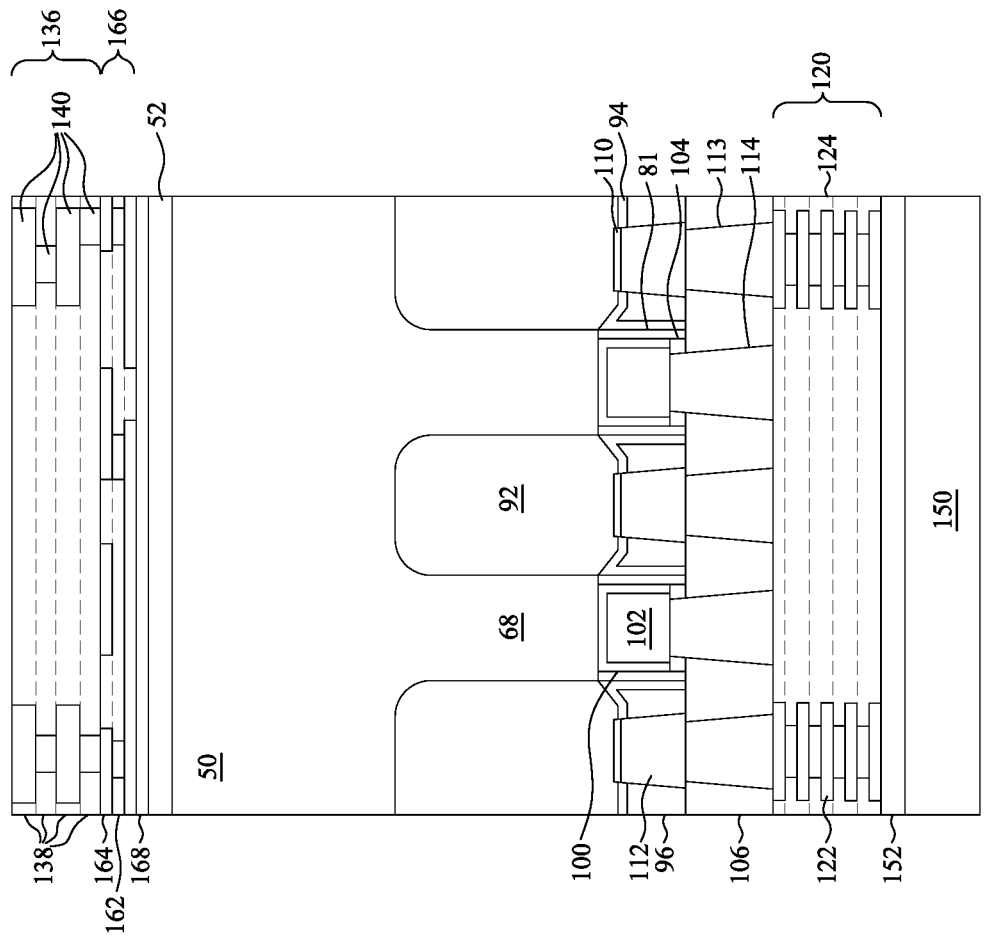
Figure 30D:
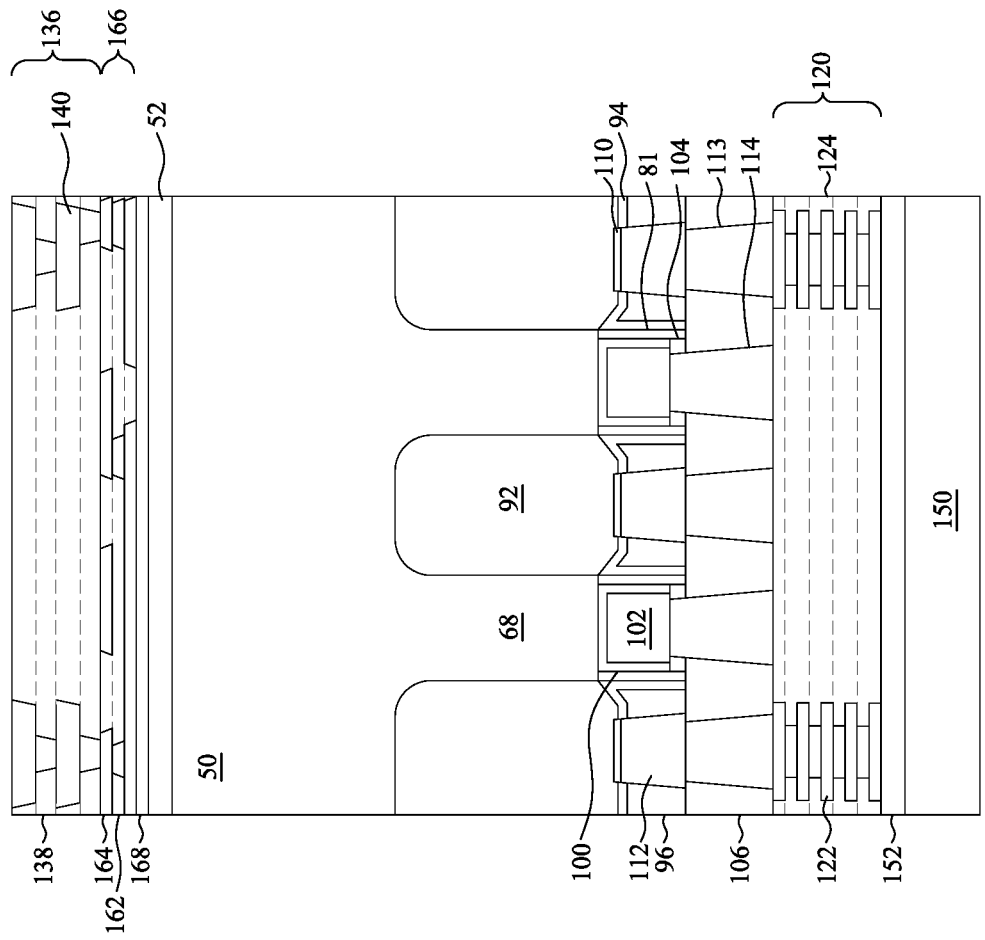

FIG. 30D illustrates an embodiment in which the first conductive features 164, the second conductive features 122, and the third conductive features 140 have tapered sidewalls. As illustrated in FIG. 30D, the first conductive features 164 have sidewalls with widths that narrow in a direction away from the substrate 50. The third conductive features 140 have sidewalls with widths that narrow in a direction towards the substrate 50. The second conductive features 122 have sidewalls which narrow in a direction towards the substrate 50. Because the first conductive features 164 are formed by the FEOL processes and the third conductive features 140 are formed by the BEOL processes, sidewalls of the first conductive features 164 and the third conductive features 140 narrow in opposite directions.

Figure 31B:
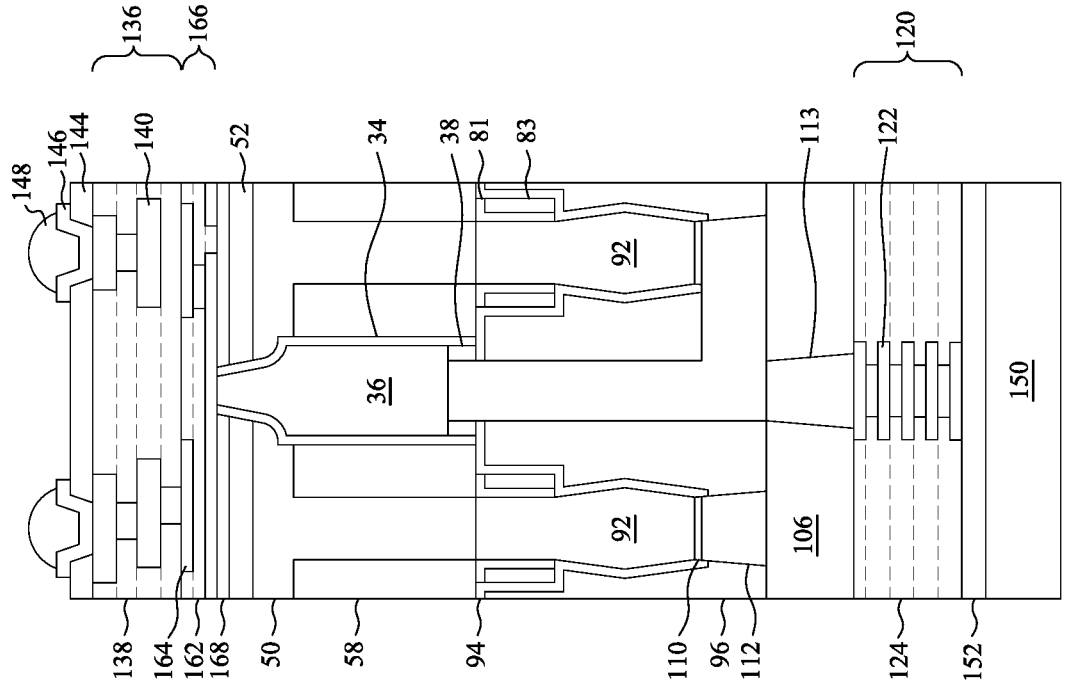
Figure 31A:
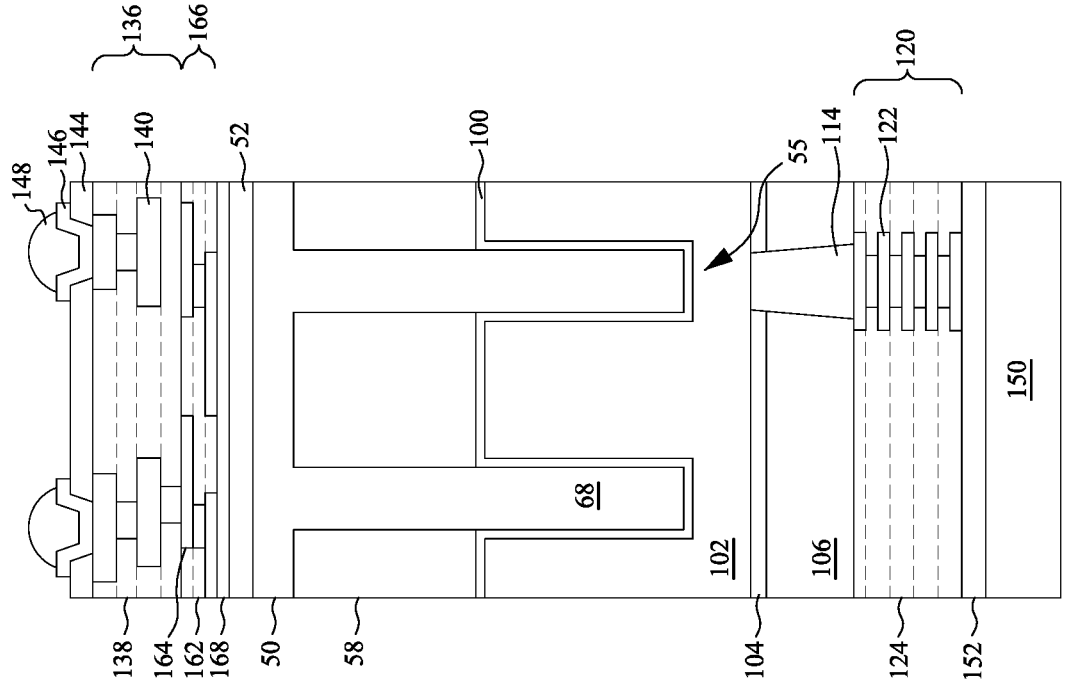
Figure 31C:
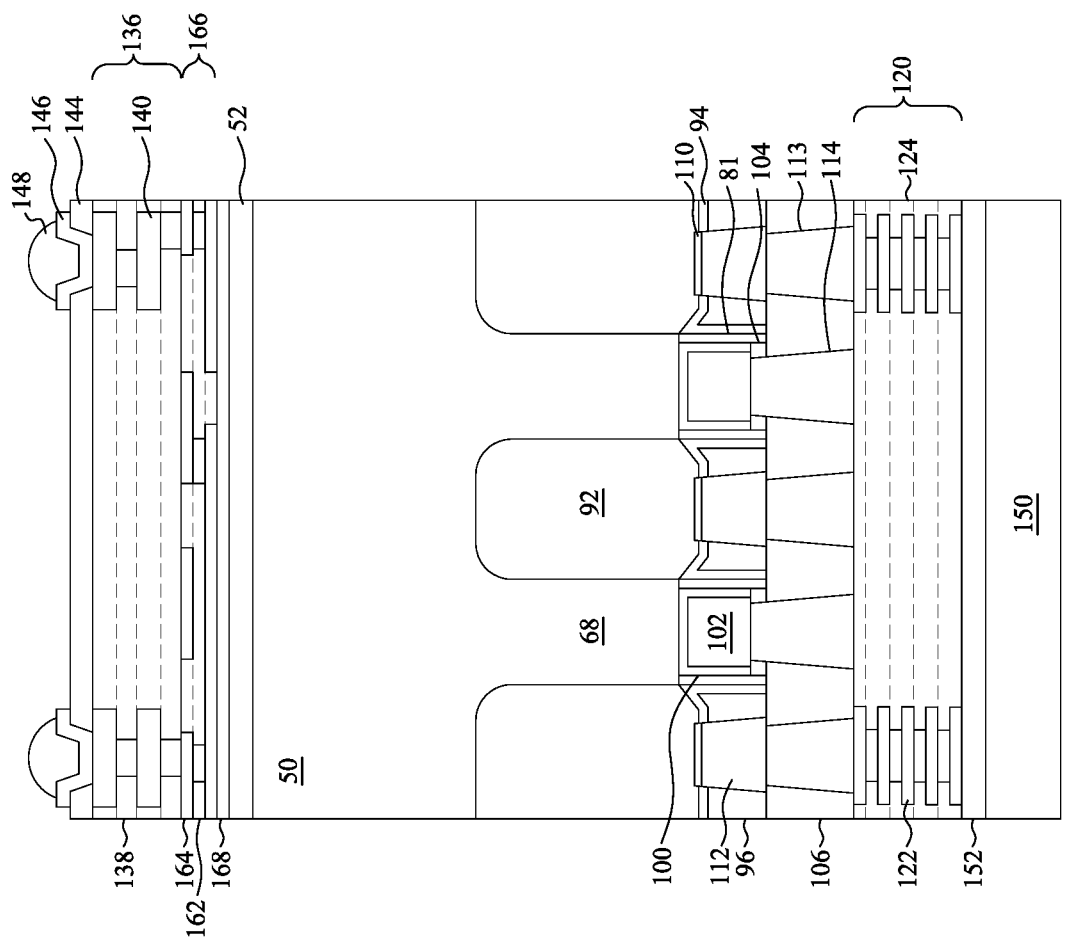

In FIGS. 31A through 31C, a passivation layer 144, UBMs 146, and external connectors 148 are formed over the second backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the third conductive features 140 in the second backside interconnect structure 136 and the external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost third conductive features 140 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the FinFETs described above.

Embodiments may achieve advantages. For example, forming first backside interconnect structures using FEOL processes allows for conductive features in the first backside interconnect structures to be formed with smaller critical dimensions and with improved overlay control. This allows for devices with smaller areas, increased device density, and reduce device defects to be formed.

The disclosed FinFET embodiments could also be applied to nanostructure devices such as nanostructure (e.g., nanosheet, nanowire, gate-all-around, or the like) field effect transistors (nano-FETs). In a nano-FET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the nano-FET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In accordance with an embodiment, a device includes a first transistor structure over a front-side of a substrate; a first backside interconnect structure over a backside of the substrate, the first backside interconnect structure including first conductive features having tapered sidewalls with widths that narrow in a direction away from the substrate; a power rail extending through the substrate, the power rail being electrically coupled to the first conductive features; and a first source/drain contact extending from the power rail to a first source/drain region of the first transistor structure. In an embodiment, the first transistor structure includes a semiconductor fin extending from the substrate, the device further includes a shallow trench isolation structure surrounding the semiconductor fin, and the power rail extends through the shallow trench isolation structure. In an embodiment, the device further includes a second backside interconnect structure over the first backside interconnect structure, the second backside interconnect structure includes second conductive features having tapered sidewalls with widths that narrow in a direction towards to the substrate. In an embodiment, the first source/drain contact is electrically coupled to a top surface of the first source/drain region through a first silicide region. In an embodiment, the first source/drain contact surrounds sidewalls of the first source/ drain region. In an embodiment, the first transistor structure includes a gate structure, the device further includes a first interlayer dielectric, the first interlayer dielectric surrounds the gate structure, and top surfaces of the first interlayer dielectric are level with a top surface of the first source/drain contact. In an embodiment, the device further includes a first dielectric layer and a second dielectric layer between the substrate and the first backside interconnect structure, the first dielectric layer being bonded to the second dielectric layer by dielectric-to-dielectric bonds.

In accordance with another embodiment, a method includes bonding a first backside interconnect structure to a semiconductor substrate; forming a semiconductor fin over the semiconductor substrate; forming a shallow trench isolation region over the semiconductor substrate and surrounding the semiconductor fin; etching the shallow trench isolation region and the semiconductor substrate to form a first recess exposing a first conductive feature of the first backside interconnect structure; and forming a conductive via in the first recess, the conductive via being electrically coupled to the first conductive feature. In an embodiment, the conductive via includes a power rail. In an embodiment, bonding the first backside interconnect structure to the semiconductor substrate includes forming dielectric-to-dielectric bonds between a first dielectric layer on the first backside interconnect structure and a second dielectric layer on the semiconductor substrate. In an embodiment, the method further includes etching the first dielectric layer and the second dielectric layer to form the first recess exposing the first conductive feature of the first backside interconnect structure. In an embodiment, the method further includes thinning the semiconductor substrate after bonding the first backside interconnect structure to the semiconductor substrate. In an embodiment, the method further includes performing a dopant implantation process on the semiconductor substrate to form a dopant-rich region in the semiconductor substrate, thinning the semiconductor substrate including performing a thermal process on the semiconductor substrate to divide the semiconductor substrate along the dopant-rich region. In an embodiment, the method further includes forming second backside interconnect structure over the first backside interconnect structure, the first conductive feature has sidewalls with widths which narrow in a direction away from the semiconductor substrate, and the second backside interconnect structure includes second conductive features having sidewalls with widths which narrow in a direction towards the semiconductor substrate.

In accordance with yet another embodiment, a method includes forming a first backside interconnect structure over a first substrate; bonding the first backside interconnect structure to a second substrate; forming a conductive via extending through the second substrate, the conductive via being electrically coupled to a first conductive feature of the first backside interconnect structure; forming a first transistor structure over the second substrate; and forming a first source/drain contact extending from a first source/drain region of the first transistor structure to the conductive via. In an embodiment, the method further includes forming a front-side interconnect structure over the first transistor structure. In an embodiment, the method further includes removing the first substrate after forming the front-side interconnect structure; and forming a second backside interconnect structure over the first backside interconnect structure. In an embodiment, the method further includes forming a first fin in the second substrate; and forming a shallow trench isolation (STI) region surrounding the first fin, forming the conductive via including etching the STI region and the second substrate to form a first recess exposing the first conductive feature. In an embodiment, forming the conductive via further includes depositing a liner layer in the first recess along sidewalls of the STI region and the second substrate, the liner layer including silicon oxide; and depositing a conductive fill material over the liner layer, the conductive fill material including tungsten. In an embodiment, bonding the first backside interconnect structure to the second substrate includes forming dielectric-to-dielectric bonds between a first dielectric layer on the second substrate and a second dielectric layer on the first backside interconnect structure, the conductive via extends through the first dielectric layer and the second dielectric layer, and the conductive via is a power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first transistor structure over a front-side of a substrate;
   a first backside interconnect structure over a backside of the substrate, the first backside interconnect structure comprising first conductive features having tapered sidewalls with widths that narrow in a direction away from the substrate;
   a second backside interconnect structure over the first backside interconnect structure, the second backside interconnect structure comprising second conductive features having tapered sidewalls with widths that narrow in a direction towards to the substrate;
   a power rail extending through the substrate, wherein the power rail comprises a single continuous conductive element extending from the first backside interconnect structure to protruding above the front-side of the substrate, wherein the power rail is electrically coupled to the first conductive features; and
   a first source/drain contact extending from the power rail to a first source/drain region of the first transistor structure.

2. The device of claim 1, wherein the first transistor structure comprises a semiconductor fin extending from the substrate, wherein the device comprises a shallow trench isolation structure surrounding the semiconductor fin, and wherein the power rail extends through the shallow trench isolation structure.

3. The device of claim 1, wherein the first source/drain contact is electrically coupled to a top surface of the first source/drain region through a first silicide region.

4. The device of claim 1, wherein the first source/drain contact surrounds sidewalls of the first source/drain region.

5. The device of claim 1, wherein the first transistor structure comprises a gate structure, wherein the device comprises a first interlayer dielectric, wherein the first interlayer dielectric surrounds the gate structure, and wherein top surfaces of the first interlayer dielectric are level with a top surface of the first source/drain contact.

6. The device of claim 1, further comprising a first dielectric layer and a second dielectric layer between the substrate and the first backside interconnect structure, wherein the first dielectric layer is bonded to the second dielectric layer by dielectric-to-dielectric bonds.

7. The device of claim 1, wherein the first backside interconnect structure has a smaller pitch than the second backside interconnect structure.

8. A semiconductor device comprising:
   a semiconductor substrate;
   a semiconductor fin on the semiconductor substrate;
   a shallow trench isolation region on the semiconductor substrate and surrounding the semiconductor fin;
   a first dielectric layer on a backside of the semiconductor substrate opposite the semiconductor fin;

a first backside interconnect structure on the first dielectric layer, wherein the first backside interconnect structure comprises a first insulating layer, a first interconnect via, and a first conductive line;

a second backside interconnect structure on the first backside interconnect structure, wherein the second backside interconnect structure comprises a second insulating layer and a second interconnect via, the second insulating layer directly contacting the first insulating layer, the first interconnect via directly contacting the first conductive line, the second interconnect via directly contacting the first conductive line, the first interconnect via having an opposite tapering from the second interconnect via; and a conductive via, wherein the conductive via comprises a single continuous conductive element extending through the shallow trench isolation region, the semiconductor substrate, and the first dielectric layer, wherein the conductive via is physically and electrically coupled to a first conductive feature of the first backside interconnect structure.

9. The semiconductor device of claim 8, wherein the conductive via is a power rail.

10. The semiconductor device of claim 8, further comprising a second dielectric layer between the first dielectric layer and the first backside interconnect structure, wherein the second dielectric layer is bonded to the first dielectric layer by dielectric-to-dielectric bonds.

11. The semiconductor device of claim 8, further comprising a dielectric liner in contact with the shallow trench isolation region, the semiconductor substrate, the first dielectric layer and the conductive via, wherein a top surface of the dielectric liner is level with a top surface of the shallow trench isolation region.

12. The semiconductor device of claim 11, further comprising a second dielectric layer extending along the conductive via and opposite side surfaces of the dielectric liner, wherein a top surface of the second dielectric layer is level with the top surface of the dielectric liner and the top surface of the shallow trench isolation region.

13. The semiconductor device of claim 12, further comprising:
a source/drain region in the semiconductor fin; and
a source/drain contact electrically coupled to the source/drain region and the first conductive feature, wherein the source/drain contact extends through the second dielectric layer.

14. The semiconductor device of claim 8, wherein the conductive via comprises tapered sidewalls that narrow in a direction towards the first backside interconnect structure.

15. A semiconductor device comprising:
a semiconductor substrate;
a first transistor structure on a front side of the semiconductor substrate;
a backside interconnect structure on a back side of the semiconductor substrate opposite the first transistor structure, wherein the backside interconnect structure comprises a conductive line, a first via directly contacting a first side of the conductive line, and a second via directly contacting a second side of the conductive line, wherein the first side of the conductive line is opposite the second side of the conductive line, wherein a width of the first via increases as the first via extends away from the conductive line, wherein a width of the second via increases as the second via extends away from the conductive line;
a conductive via comprising a single continuous conductive element extending through the semiconductor substrate, the single continuous conductive element protruding from the front side of the semiconductor substrate, the conductive via being electrically coupled to a first conductive feature of the backside interconnect structure; and
a first source/drain contact extending from a first source/drain region of the first transistor structure to the conductive via.

16. The semiconductor device of claim 15, further comprising a front-side interconnect structure on the first transistor structure opposite the backside interconnect structure.

17. The semiconductor device of claim 15, further comprising:
a first fin extending from the semiconductor substrate; and
a shallow trench isolation (STI) region surrounding the first fin, wherein the conductive via extends through the STI region and the semiconductor substrate.

18. The semiconductor device of claim 17, further comprising a first dielectric layer between the semiconductor substrate and the backside interconnect structure, wherein the conductive via extends through the first dielectric layer.

19. The semiconductor device of claim 18, wherein the conductive via comprises:
a liner layer in contact with side surfaces of the STI region, the semiconductor substrate, and the first dielectric layer, wherein the liner layer comprises silicon oxide; and
a conductive fill material on the liner layer, wherein the conductive fill material comprises tungsten.

20. The semiconductor device of claim 15, further comprising a first dielectric layer and a second dielectric layer between the semiconductor substrate and the backside interconnect structure, wherein the second dielectric layer is bonded to the first dielectric layer by dielectric-to-dielectric bonds, wherein the conductive via extends through the first dielectric layer and the second dielectric layer, and wherein the conductive via is a power rail.

* * * * *